US012675407B2

(12) United States Patent
Lee et al.

(10) Patent No.: US 12,675,407 B2
(45) Date of Patent: Jul. 7, 2026

(54) MEMORY MODULE WITH LOCAL CLOCK SIGNALS

(71) Applicant: NETLIST, INC., Irvine, CA (US)

(72) Inventors: Hyun Lee, Ladera Ranch, CA (US); Jayesh Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 18/935,410

(22) Filed: Nov. 1, 2024

(65) Prior Publication Data

US 2025/0181504 A1      Jun. 5, 2025

Related U.S. Application Data

(63) Continuation of application No. 18/059,958, filed on Nov. 29, 2022, now Pat. No. 12,135,644, which is a continuation of application No. 17/141,978, filed on Jan. 5, 2021, now Pat. No. 11,513,955, which is a continuation of application No. 16/432,700, filed on Jun. 5, 2019, now Pat. No. 10,884,923, which is a continuation of application No. 14/445,035, filed on Jul. 28, 2014, now Pat. No. 10,324,841.

(60) Provisional application No. 61/859,215, filed on Jul. 27, 2013.

(51) Int. Cl.
*G06F 12/0802* (2016.01)
*G11C 5/04* (2006.01)
*G11C 7/10* (2006.01)
*G11C 29/02* (2006.01)

(52) U.S. Cl.
CPC ............ *G06F 12/0802* (2013.01); *G11C 5/04* (2013.01); *G11C 7/1066* (2013.01); *G11C 7/1093* (2013.01); *G11C 29/023* (2013.01); *G11C 29/028* (2013.01)

(58) Field of Classification Search
CPC .... G06F 12/0802; G06F 1/10; G06F 13/4243; G06F 13/4256; G11C 5/04; G11C 7/1066; G11C 7/1093; G11C 29/023; G11C 29/028
USPC .................................................. 711/120, 119
See application file for complete search history.

(56) References Cited

U.S. PATENT DOCUMENTS

2004/0105292 A1* 6/2004 Matsui ................. G11C 7/1093
                                                           365/189.05
2007/0168781 A1* 7/2007 Sutardja ................. G11C 29/76
                                                           714/718
2010/0115191 A1* 5/2010 Hampel ................. G11C 29/32
                                                           711/170

* cited by examiner

*Primary Examiner* — Hosain T Alam
*Assistant Examiner* — Zubair Ahmed
(74) *Attorney, Agent, or Firm* — USCH Law, PC

(57) ABSTRACT

A memory module is operable in a computer system having a memory controller and a system bus and comprises memory devices organized in a plurality of groups, and circuits coupled to the memory devices. The circuits including circuitry configurable to receive from the memory controller a system clock and input control and address (C/A) signals, and to generate a module clock signal and module C/A signals in response to the system clock and input C/A signals. The circuits further include circuitry configurable to generate a plurality of local clock signals corresponding, respectively, to the plurality of groups of memory devices, and to output the plurality of local clock signals to respective groups of the memory devices. A respective local clock signal has a respective phase relationship with the module clock signal and is output to a corresponding group of the memory devices.

20 Claims, 22 Drawing Sheets

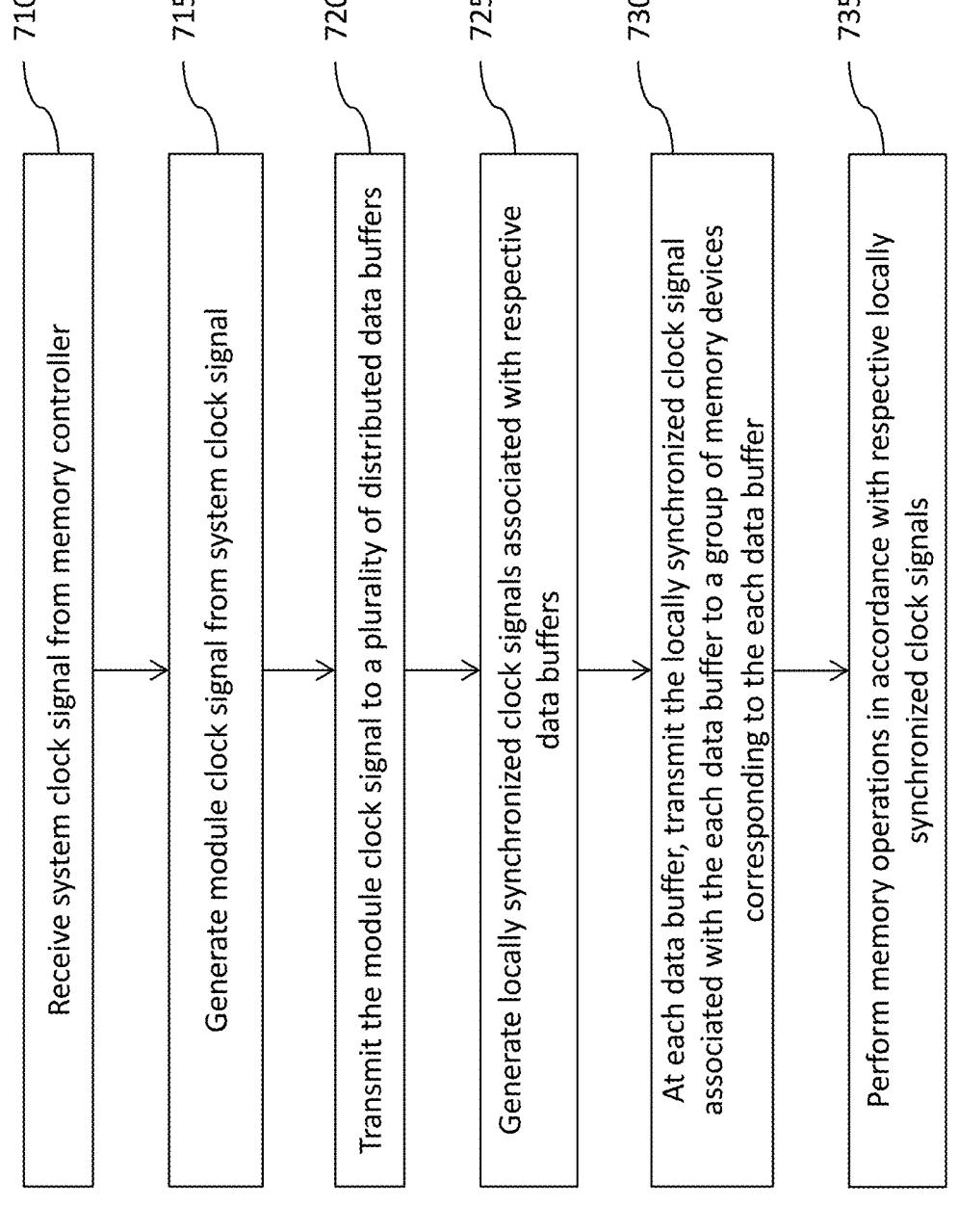

710 Receive system clock signal from memory controller

715 Generate module clock signal from system clock signal

720 Transmit the module clock signal to a plurality of distributed data buffers

725 Generate locally synchronized clock signals associated with respective data buffers 730 At each data buffer, transmit the locally synchronized clock signal associated with the each data buffer to a group of memory devices corresponding to the each data buffer 735 Perform memory operations in accordance with respective locally synchronized clock signals

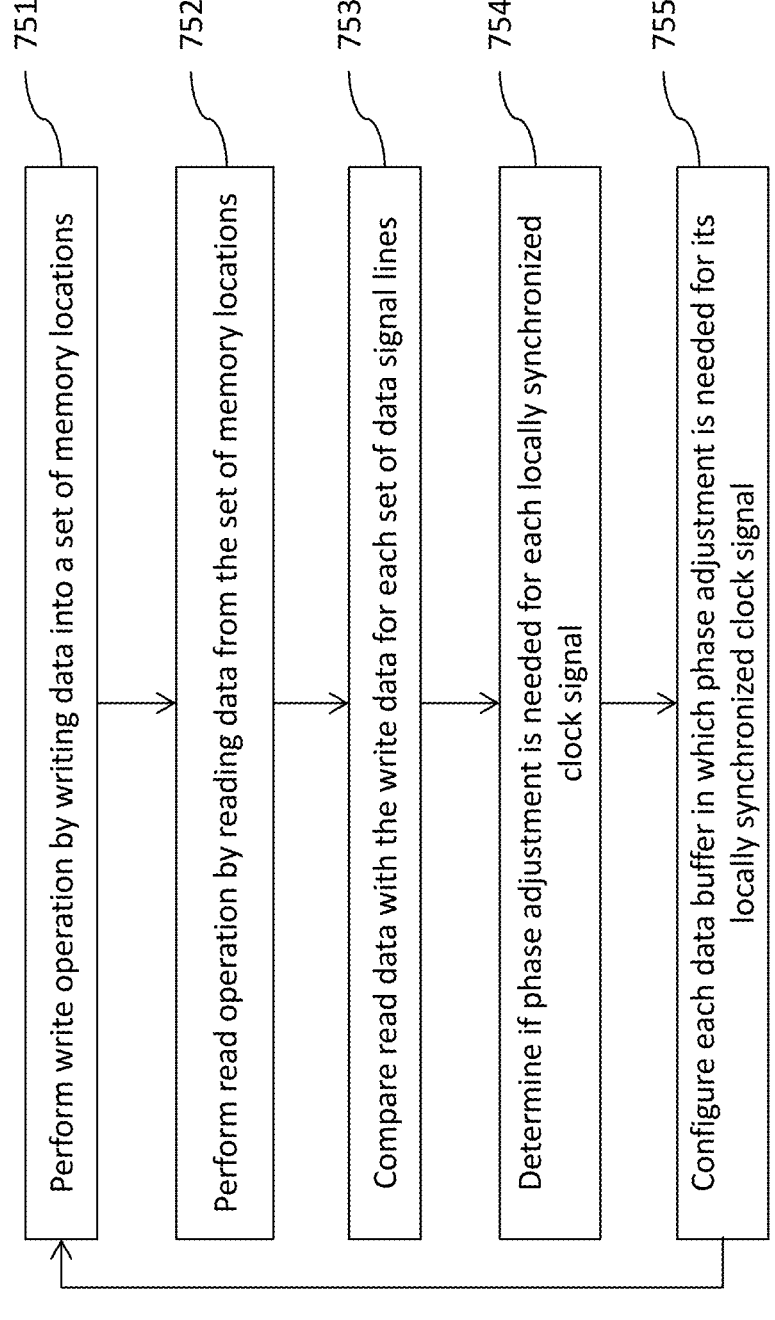

751 — Perform write operation by writing data into a set of memory locations

752 — Perform read operation by reading data from the set of memory locations

753 — Compare read data with the write data for each set of data signal lines

754 — Determine if phase adjustment is needed for each locally synchronized clock signal 755 — Configure each data buffer in which phase adjustment is needed for its locally synchronized clock signal

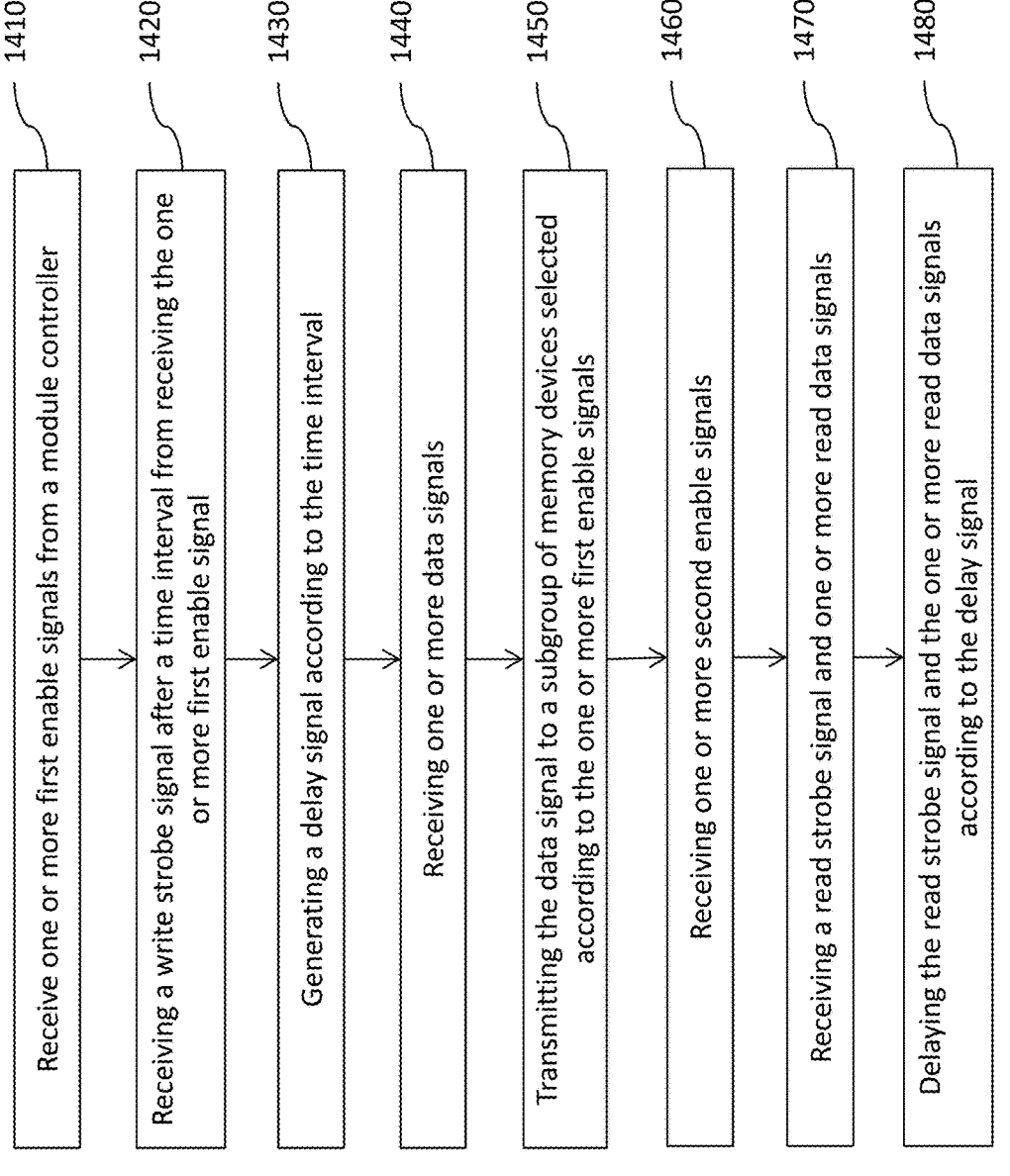

1410 — Receive one or more first enable signals from a module controller

1420 — Receiving a write strobe signal after a time interval from receiving the one or more first enable signal 1430 — Generating a delay signal according to the time interval 1440 — Receiving one or more data signals 1450 — Transmitting the data signal to a subgroup of memory devices selected according to the one or more first enable signals 1460 — Receiving one or more second enable signals 1470 — Receiving a read strobe signal and one or more read data signals 1480 — Delaying the read strobe signal and the one or more read data signals according to the delay signal

MEMORY MODULE WITH LOCAL CLOCK SIGNALS

CROSS REFERENCE TO RELATED APPLICATIONS

The present application is a continuation of U.S. patent application Ser. No. 18/059,958, filed on Nov. 29, 2022 (now U.S. Pat. No. 12,135,644), entitled "Memory Module with Static and Dynamic Timing Adjustment in Data Buffers," which is a continuation of U.S. patent application Ser. No. 17/141,978, filed on Jan. 5, 2021 (now U.S. Pat. No. 11,513,955), entitled "Memory Module with Local Synchronization and Method of Operation," which is a continuation of U.S. patent application Ser. No. 16/432,700, filed on Jun. 5, 2019 (now U.S. Pat. No. 10,884,923), entitled "Memory Module with Local Synchronization and Method of Operation," which is a continuation of U.S. patent application Ser. No. 14/445,035, filed on Jul. 28, 2014 (now U.S. Pat. No. 10,324,841), entitled "Memory Module with Local Synchronization," which claims priority to U.S. Provisional Patent Application No. 61/859,215, filed Jul. 27, 2013, each of which is incorporated herein by reference in its entirety.

FIELD

The disclosure herein is related generally to memory modules, and more particularly to memory modules having distributed data buffers.

BACKGROUND

With recent advancement of information technology and widespread use of the Internet to store and process information, more and more demands are placed on the acquisition, processing, storage and dissemination of vocal, pictorial, textual and numerical information by microelectronics-based combination of computing and communication means. In a typical computer or server system, memory modules are used to store data or information. A memory module usually includes multiple memory devices, such as dynamic random access memory devices (DRAM) or synchronous dynamic random access memory devices (SDRAM), packaged individually or in groups, and/or mounted on a printed circuit board (PCB). A processor or a memory controller accesses the memory module via a memory bus, which, for a single-in-line memory module (SIMM), can have a 32-bit wide data path, or for a dual-in-line memory module (DIMM), can have a 64-bit wide data path.

The memory devices of a memory module are generally organized in ranks, with each rank of memory devices generally having a bit width. For example, a memory module in which each rank of the memory module is 64 bits wide is described as having an "x64" or "by 64" organization. Similarly, a memory module having 72-bit-wide ranks is described as having an "x72" or "by 72" organization.

The memory capacity or memory density of a memory module increases with the number of memory devices on the memory module. The number of memory devices of a memory module can be increased by increasing the number of memory devices per rank or by increasing the number of ranks.

In certain conventional memory modules, the ranks are selected or activated by control signals from a processor or memory controller during operation. Examples of such control signals include, but are not limited to, rank-select signals, also called chip-select signals. Most computer and server systems support a limited number of ranks per memory module, which limits the memory density of the memory modules that can be used in these computer and server systems.

For memory devices in such a memory module to be properly accessed, distribution of control signals and a control clock signal in the memory module is subject to strict constraints. In some conventional memory modules, control wires are routed so that there is an equal length of signal path to each memory component, in order to eliminate variation of the timing of the control signals and the control clock signal between different memory devices in the memory modules. The balancing of the length of the wires to each memory devices compromises system performance, limits the number of memory devices, and complicates their connections.

In some conventional memory systems, the memory controllers include leveling mechanisms for write and/or read operations to compensate for unbalanced wire lengths and memory device loading on the memory module. As memory operating speed and memory density continue to increase, however, such leveling mechanisms are also insufficient to insure proper timing of the control and/or data signals received and/or transmitted by the memory modules.

BRIEF DESCRIPTION OF THE DRAWINGS

FIG. 7A is a flowchart illustrating a method of operation for a memory module according to certain embodiments.

FIG. 7B is a flowchart illustrating a method of training locally synchronized clock signals according to certain embodiments.

FIG. 14 is a flowchart illustrating a method for data edge alignment according to embodiments.

DESCRIPTION OF EMBODIMENTS

A memory module according to one embodiment includes memory devices organized in groups, a module control device, and data buffers (DB). The data buffers are sometimes referred to herein as buffer circuits, isolation circuits, isolation devices or load reduction devices. The memory module is operable to perform memory operations in response to memory commands (e.g., read, write, refresh, precharge, etc.), each of which is represented by a set of control/address (C/A) signals transmitted by the memory controller to the memory module. The C/A signals may include, for example, a row address strobe signal (/RAS), a column address strobe signal (/CAS), a write enable signal (/WE), an output enable signal (/OE), one or more chip select signals, row/column address signals, and bank address signals. The memory controller may also transmit a system clock signal to the memory module. In one embodiment, the C/A signals and the system clock signal are received by the module control device, which generates a set of module control/address (C/A) signals and a set of data buffer control signals in response to each memory command from the memory controller. The module C/A signals are transmitted by the module control device to the memory devices via module C/A signal lines, and the data buffer control signals (referred sometimes herein as DBCS) are transmitted by the module control device to the buffer circuits via data buffer control signal lines.

In certain embodiments, the buffer circuits are associated with respective groups of memory devices and are distributed across the memory module at positions corresponding to the data/strobe signal lines associated with the respective groups of memory devices. Thus, during certain high speed operations, each data buffer control signal may arrive at different buffer circuits at different points of time across more than one clock cycle of the system clock. Also, each buffer circuit associated with a respective group of memory devices is in the data paths between the respective group of memory devices and the memory controller. Thus, the memory controller does not have direct control of the memory devices. In one embodiment, each group of memory devices include at least two subgroups, each subgroup including at least one memory device. Each buffer circuit is configured to enable a selected subgroup in the respective group of memory devices to communicate data with the memory controller in response to the data buffer control signals. The memory module can have more ranks of memory devices than what is supported by the memory controller.

Figure 1:
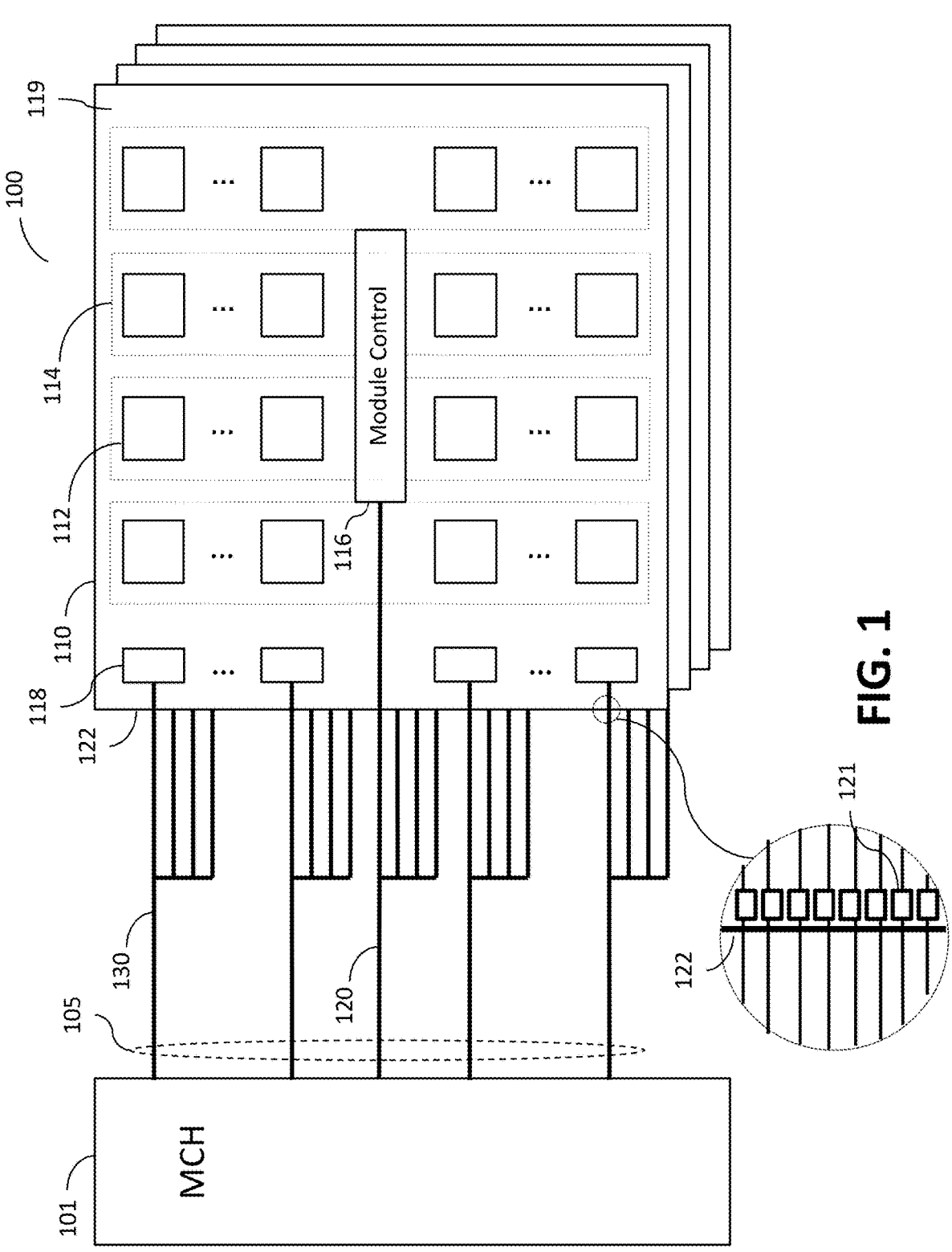
FIG. 1 is a diagram illustrating a memory system including at least one memory module according to one embodiment.

FIG. 1 shows a system 100 including a system or host memory controller (MCH) 101 and one or more memory modules 110 coupled to the MCH by a memory bus 105, according to one embodiment. As shown, the memory bus includes C/A signal lines 120 and groups of system data/strobe signal lines 130. Also as shown, each memory module 110 has a plurality of memory devices 112 organized in a plurality of ranks 114. Each memory module 110 further includes a module control circuit (module controller or module control device) 116 coupled to the MCH 101 via the C/A signal lines 120, and a plurality of buffer circuits or data buffers 118 coupled to the MCH 101 via respective groups of system data/strobe signal lines 130. In one embodiment, the memory devices 112, the module control circuit 116 and the data buffers 118 can be mounted on a same side or different sides of a printed circuit board (module board) 119, which has connectors 121 formed along an edge 122 thereof for connecting to respective ones of the C/A signal lines 120 and groups of system data/strobe signal lines 130.

In the context of the present description, a rank refers to a set of memory devices that are selectable by a same chip select signal from the memory controller. The number of ranks of memory devices in a memory module 110 may vary. For example, as shown, each memory module 110 may include four ranks of memory devices 112. In another embodiment, the memory module 110 may include 2 ranks of memory devices. In yet another embodiment, the memory module may include six or more ranks of memory devices 112.

In the context of the present description, a memory controller refers to any device capable of sending instructions or commands, or otherwise controlling the memory devices 112. Additionally, in the context of the present description, a memory bus refers to any component, connection, or groups of components and/or connections, used to provide electrical communication between a memory module and a memory controller. For example, in various embodiments, the memory bus 105 may include printed circuit board (PCB) transmission lines, module connectors, component packages, sockets, and/or any other components or connections that provide connections for signal transmission.

Furthermore, the memory devices 112 may include any type of memory devices. For example, in one embodiment, the memory devices 112 may include dynamic random access memory (DRAM) devices, such as Synchronous dynamic random access memory (SDRAM) devices in compliance with, for example, the Double Data Rate Type 3 (DDR3) or Double Data Rate Type 4 (DDR4) standard. Additionally, in one embodiment, each memory module 110 may include a dual in-line memory module (DIMM).

Figure 2A:
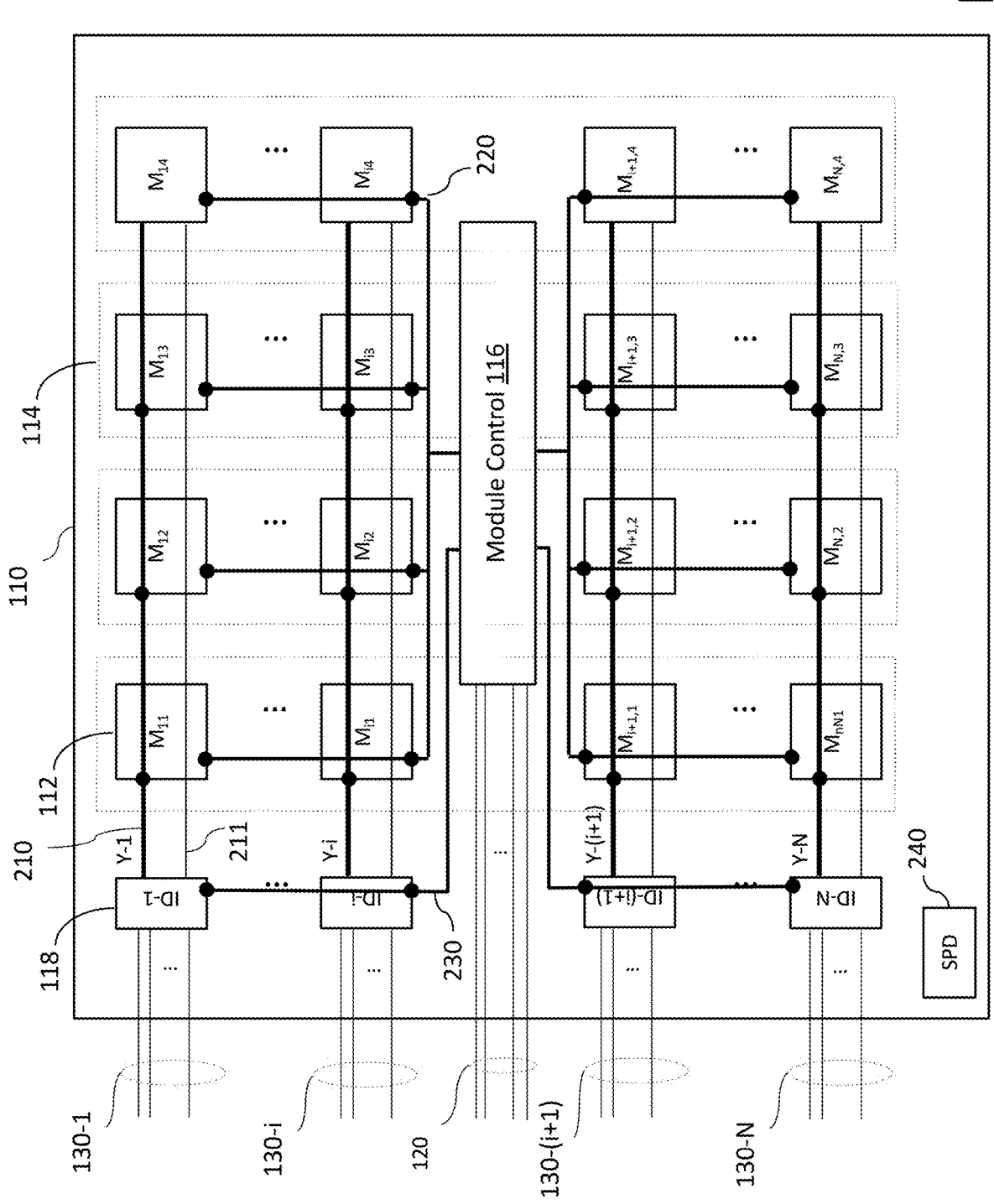
FIGS. 2A-2D are each a diagrams illustrating interactions among components in a a memory module according to certain embodiments.

As shown in FIG. 2A, which illustrates one memory module 110 according to an embodiment, the buffer circuits are coupled to respective groups of the system data/strobe signal lines 130 and are distributed across the memory module at positions corresponding to the respective groups of system data/strobe signal lines 130. The module control device 116 is coupled to the system C/A signal lines 120 and receives system memory commands represented by a set of system control/address (C/A) signals from the MCH 101 via signal lines 120. The module control device 116 generates module C/A signals and data buffer control signals based on memory commands from the system. The module control device 116 also received a system clock MCK and generates a module clock signal CK in response to the system clock signal MCK. The MCK signal may include a pair of complementary clock signals, MCK and $\overline{MCK}$, and the module clock signal may include a pair of complementary clock signals CK and $\overline{CK}$.

Examples of the system C/A signals include, but are not limited to, Chip Select (or /CS) signal, which is used to select a rank of memory devices to be accessed during a memory (read or write) operation; Row Address Strobe (or /RAS) signal, which is used mostly to latch a row address and to initiate a memory cycle; Column Address Strobe (or /CAS) signal, which is used mostly to latch a column address and to initiate a read or write operation; address signals, including bank address signals and row/column address signals, which are used to select a memory location on a memory device or chip; Write Enable (or /WE) signal, which is used to specify a read operation or a write operation, Output Enable (or /OE) signal, which is used to prevent data from appearing at the output until needed during a read operation, and the system clock signal MCK.

Examples of module C/A signals include, but are not limited to one or more module /CS signals; a module /RAS signal, which can be, for example, a registered version of the system /RAS signal; a module /CAS signal, which can be, for example, a registered version of the system /CAS signal; module address signals, which can be, for example, registered versions of some or all of the address signals; a module /WE signal, which can be, for example, a registered version of the system /WE signal; a module /OE signal, which can be, for example a registered version of the system /OE signal. In certain embodiments, the module C/A signals may also include the module clock signal CK. The one or more module C/S signals can be derived from the system /CS signals and one or more other system C/A signals, such as one or more bank address signals and/or one or more row/column address signals, as exemplified in commonly owned U.S. Pat. No. 7,532,537, entitled "Memory Module with a Circuit Providing Load Isolation and Memory Domain Translation," issued on May 12, 2009, the entirety of which is incorporated herein by reference.

Examples of data buffer control signals include, but are not limited to, one or more mode signals, which specify a mode of operation (e.g., configuration mode, test mode or normal operation mode) for the data buffers 118, and other data buffer control signals whose definitions depend on the mode of operation. For example, during the normal operation mode the other data buffer control signals may include one or more enable signals, one or more ODT signals, and the module clock signal. In the normal operation mode, the one or more enable signals are used by each data buffer to select one or more memory devices to communicate data with the memory controller; and the one or more ODT signals are used by the data buffers to set up on-die termination for the data/strobe signals. In the configuration mode or test mode, the other data buffer control signals are used to convey configuration or module self-test control information from the module control device 116 to the data buffers 118. In one embodiment, the data buffer control signals are transmitted to the data buffers 118 via respective data buffer control signal lines 230. Alternatively, the data buffer control signals can be packetized before being transmitted to the data buffers 118 via the data buffer control signal lines and decoded/processed at the data buffers.

Module control device 116 transmits the module C/A signals to the memory devices 112 via module C/A signal lines 220. The memory devices 112 operate in response to the module C/A signals to receive write data or output read data as if the module C/A signals were from a memory controller. The module control device transmits the data buffer control signals together with the module clock signal CK to the data buffers 118 via data buffer control signal lines 230. As shown in FIG. 2, at least some of the memory devices in a same rank share a same set of module C/A signal lines 220, and at least some of the data buffers 118 share a same set of data buffer control signal lines 230.

Figure 2B:
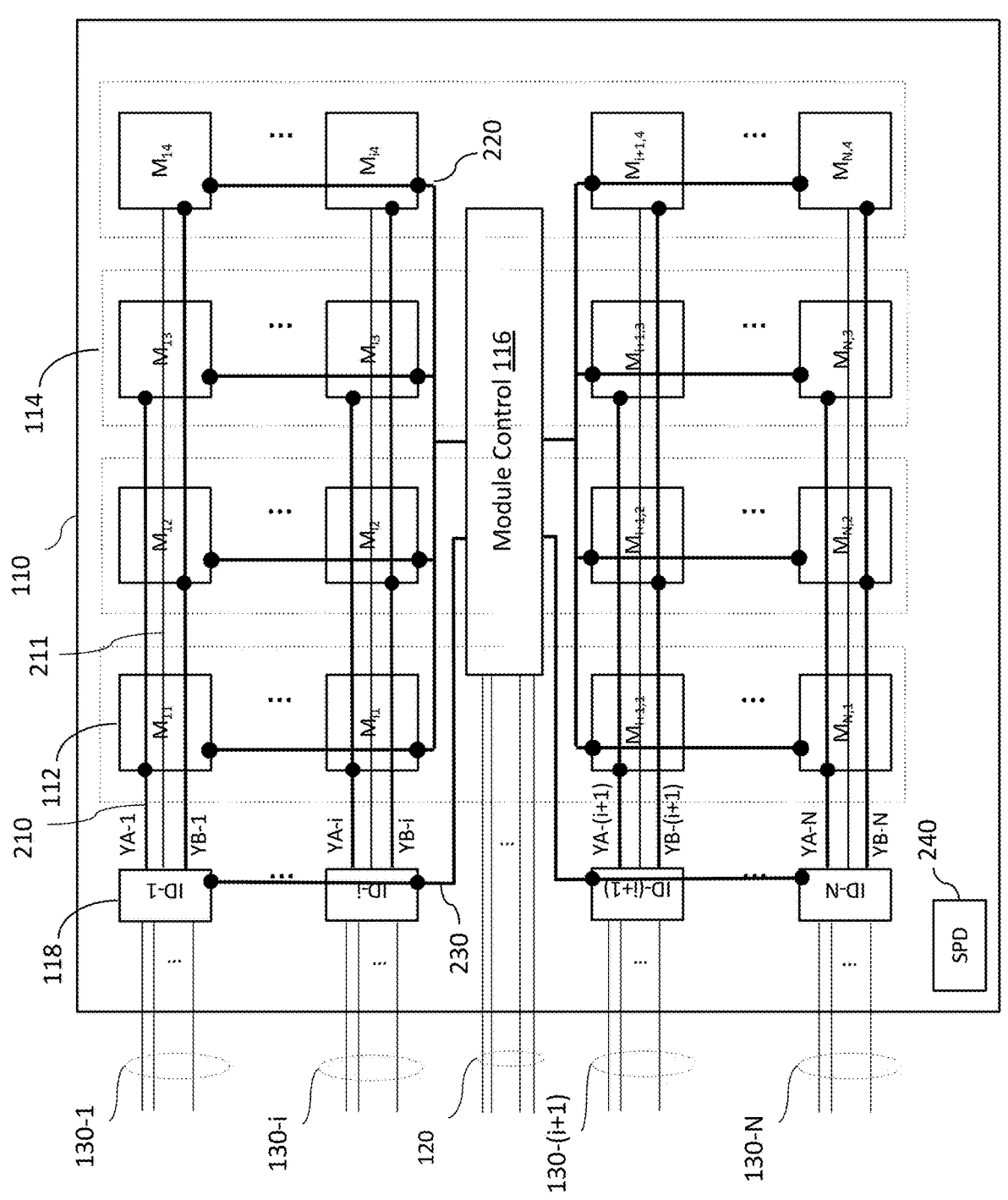

As shown n FIGS. 2A and 2B, each rank 114 includes N memory devices, where N is an integer larger than one. For example, a first rank includes memory devices $M_{11}$, . . . , $M_{i1}$, $M_{i+1,1}$, . . . , $M_N$, a second rank includes memory devices $M_{12}$, . . . , $M_{i2}$, $M_{i+1, 2}$, . . . , $M_{N,2}$, and so on. In one embodiment, the memory devices 112 are also organized in groups or sets, with each group corresponding to a respective group of system data/strobe signal lines 130 and including at least one memory device from each rank. For example, memory devices $M_{11}$, $M_{12}$, $M_{13}$, and $M_{14}$ form a first group of memory devices, memory devices $M_{i1}$, $M_{i2}$, $M_{i3}$, and $M_{i4}$ form an $i^{th}$ group of memory devices, and so on.

In certain embodiments, the data buffers 118 are associated with respective groups of memory devices and are coupled between respective groups of system data/strobe signal lines 130 and the respective groups of memory devices. For example, data buffer ID-1 among the data buffers 118 is associated with the first group of memory devices $M_{11}$, $M_{12}$, $M_{13}$, and $M_{14}$ and is coupled between the group of system data/strobe signal lines 130-1 and the first group of memory devices, data buffers ID-i among the data buffers 118 is associated with the $i^{th}$ group of memory devices $M_{i1}$, $M_{i2}$, $M_{i3}$, and $M_{i4}$ and is coupled between the group of system data/strobe signal lines 130-i and the $i^{th}$ group of memory devices, and so on. The association of data buffers with groups of memory devices may not be exclusive, i.e., multiple data buffers may be associated with a same group of memory devices, or vice versa.

In one embodiment, each group or sets of memory devices are coupled to the associated data buffer 118 via a set of module data/strobe lines 210 and one or more clock signal lines 211. Each group or set of memory devices is organized in subgroups or subsets, with each subgroup or subset including at least one memory device. The subgroups in a group of memory devices may be coupled to the associated data buffer 118 via a same set of module data/strobe lines 210 (as shown in FIG. 2A) or via respective subsets of module data/strobe lines 210 (as shown in FIG. 2B). For example, as shown in FIG. 2B, in the first group of memory devices, memory devices $M_{11}$ and/or $M_{13}$ form a first subgroup, and memory devices $M_{12}$ and/or $M_{14}$ form a second subgroup; in the $i^{th}$ group of memory devices, memory devices $M_{i1}$ and/or $M_{i3}$ form a first subgroup, and memory devices $M_{i2}$ and/or $M_{i4}$ form a second subgroup; and so on. The first subgroup of at least one memory device in each group of memory devices is coupled to the associated data buffer 118 via an associated first subset of module data/strobe lines YA, and the second subgroup of at least one memory device in each group of memory devices is coupled to the associated data buffer via an associated second subset of module data/strobe lines YB, as shown. For example, memory devices $M_{11}$ and/or $M_{13}$ form the first subgroup are/is coupled to the data buffer ID-1 via the corresponding first subset of module data/strobe lines YA-1, and memory devices $M_{12}$ and/or $M_{14}$ form the second subgroup are/is coupled to the data buffer ID-1 via the corresponding second subset of module data/strobe lines YA-2.

In one embodiment, the data buffers 118 are in the data paths between the MCH 101 and the memory module 110 and include data buffers between the MCH 101 and the respective groups of memory devices. In one embodiment, each data buffer 118 is configured to enable a selected subgroup in the respective group of memory devices to communicate data with the MCH 101 in response to the data buffer control signals. Further, each data buffers 118 is configured to isolate unselected subgroup(s) of memory devices from the MCH 101 during write operations, so that the MCH sees a load on each data line that is less than a load associated with the respective group of memory devices. In one embodiment, the MCH sees only a load associated with one memory device on each data/strobe signal line during write operations.

In one embodiment, the data buffers 118 are distributed across the memory module 110 or the module board 119 in positions corresponding to edge connectors 121 coupled to respective groups of system data/strobe signal lines 130. For example, as shown in FIGS. 2A and 2B, data buffer ID-1 is disposed in a first position corresponding to the first group of memory devices $M_{11}$, $M_{12}$, $M_{13}$, and $M_{14}$, or to the first group of system data/strobe signal lines 130-1. Likewise, data buffer ID-i is disposed in an $i^{th}$ position separate from the first position and corresponding to the $i^{th}$ group of memory devices $M_{i1}$, $M_{i2}$, $M_{i3}$, and $M_{i4}$, or to the $i^{th}$ group of system data/strobe signal lines 130-i. In one embodiment, the first position is between the first group of memory devices and an edge portion of the module board 119 where connections to the first group of data/strobe signal lines 130-1 are disposed, and the $i^{th}$ position is between the $i^{th}$ group of memory devices and an edge portion of the module board 119 where connections (not shown) to the $i^{th}$ group of data/strobe signal lines 130-i are disposed. In one embodiment, the data buffers 118 are distributed along the edge 122 of the memory module 110. In one embodiment, each data buffer 118 is in a separate integrated circuit device package either by itself or together with at least some of the respective group of memory devices. In one embodiment, the module data/strobe signal lines 210, the module C/A signal lines 220, and the data buffer control signal lines 230 include signal traces formed on and/or in the module board 119.

As an option, memory module 110 may further include a serial-presence detect (SPD) device 240, which may include electrically erasable programmable read-only memory (EE-PROM) for storing data that characterize various attributes of the memory module 110. Examples of such data include a number of row addresses, a number of column addresses, a data width of the memory devices, a number of ranks on the memory module 110, a memory density per rank, a number of memory device on the memory module 110, and a memory density per memory device, etc. A basic input/output system (BIOS) of system 100 can be informed of these attributes of the memory module 110 by reading from the SPD 240 and can use such data to configure the MCH 101 properly for maximum reliability and performance.

In certain embodiments, the SPD 240 and/or the control circuit 116 store module configuration information, such as: memory space translation code, memory address mapping function code, input and output signals timing control information for the control circuit 116, electrical and logical level control information for input and output signals for the control circuit 116, the data buffers 118, etc. In certain embodiments, the SPD 240 contains a system view of the module 110 which can be different from an actual physical construction of the module 110. For example, the SPD 240 stores at least one memory operation parameter that is different from a corresponding memory operation parameter in a system memory controller setting. The SPD 240 may also store at least on data buffer operation parameter that is different from a corresponding parameter in the system memory controller setting.

Thus, in certain embodiment, in the memory module 110, C/A signals representing a memory command are received and buffered by the module control circuit 116, so that the MCH sees only the module control circuit 116 as far as the C/A signals are concerned. Write data and strobe signals from the controller are received and buffered by the data buffers 118 before being transmitted to the memory devices 112 by the data buffers 118. On the other hand, read data and strobe signals from the memory devices are received and buffered by the data buffers before being transmitted to the MCH via the system data/strobe signal lines 130. Thus, MCH 101 does not directly operate or control the memory devices 112. As far as data/strobe signals are concerned, the MCH 101 mainly sees the data buffers 118, and the system 100 depends on the data buffers 118 to properly time the transmission of the data and strobe signals between the MCH 101 and the memory devices 112.

In certain embodiments, the memory module 110 is a dual in-line memory module (DIMM) and the memory devices are double data rate (DDR) dynamic random access memory devices (DRAM). In certain embodiments, the control circuit 116 includes a DDR register, and logic for memory space translation between a system memory domain and a module level physical memory domain. Such translation may produce address mapping, proper interface timing for the control signals to the module level physical memory domain, and a proper interface electrical and logical level for the control signals to the module level physical memory domain.

Figure 2C:
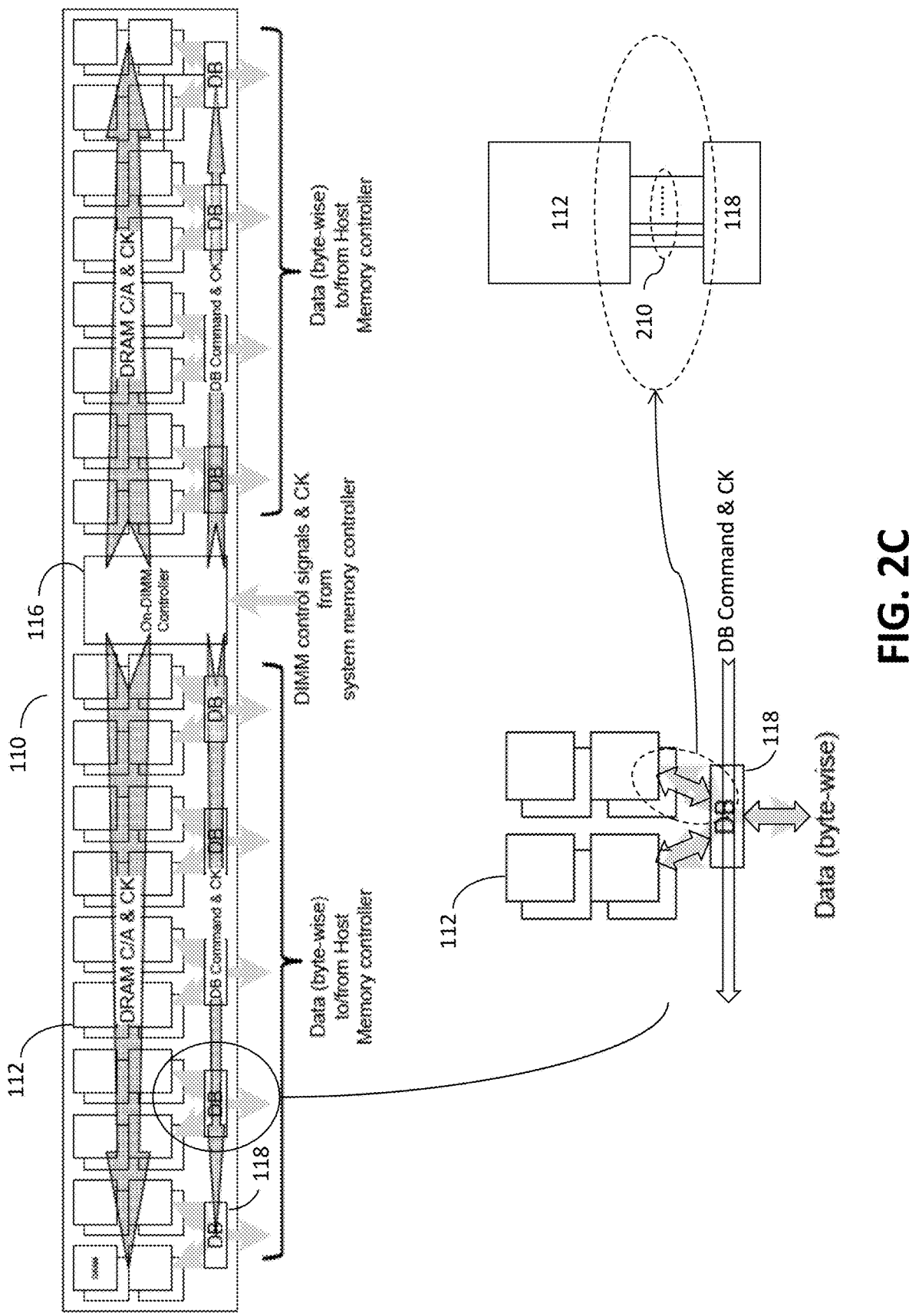

As shown in FIG. 2C, in certain embodiments, the control circuit 116 transmits registered C/A and clock signals to the memory devices 112 in a fly-by configuration, and transmits data buffer control signals and registered clock signal to the data buffers 118 in a fly-by configuration. In a fly-by signal routing configuration, signals are routed such that they connect to each a row of devices in a daisy chain topology. Thus, signals routed in a fly-by configuration would arrive skewed in time at different devices. As the speed of memory operations increase, issues can also arise with respect to signal alignment for input, output delay variation due to process, voltage and temperature (PVT) variations, lack of synchronization with system memory controller interface, and phase drift accumulation during operation, etc. Electrical interface calibration drift during operation caused by charge build up and timing interface calibration drift during operation caused by environment change can also create issues.

For example, to offset the skew in the registered C/A signals, certain memory devices (e.g., the DDR3 SDRAM) have a training mode that permits the MCH to effectively zero-out the skew and re-align the data in time by adding delay to the data paths. In certain embodiments, however, load reduction mechanism in the data buffers 118 would provide a single data bus interface for the memory devices, which hides the data interfaces between the memory devices 112 and the data buffers 118 from the system memory controller 101. Thus, a long sequence of interface timing training may be required because the system memory controller 101 has very limited control over the interface between the memory devices 112 and the data buffers 118. Furthermore, interface signal alignment-drift after the initial training would not be easily detected by the system memory controller 101, which may cause silent system failure.

Moreover, clock skew amongst the memory devices 112 and the data buffers 118 can cause synchronization issues. As the speed of memory operation increase, data period can become so short that variation of signal propagation time through I/Os becomes a very significant portion of a data period. As a result, the clock skew issues cannot simply be addressed by pipelining the data paths.

Figure 2D:
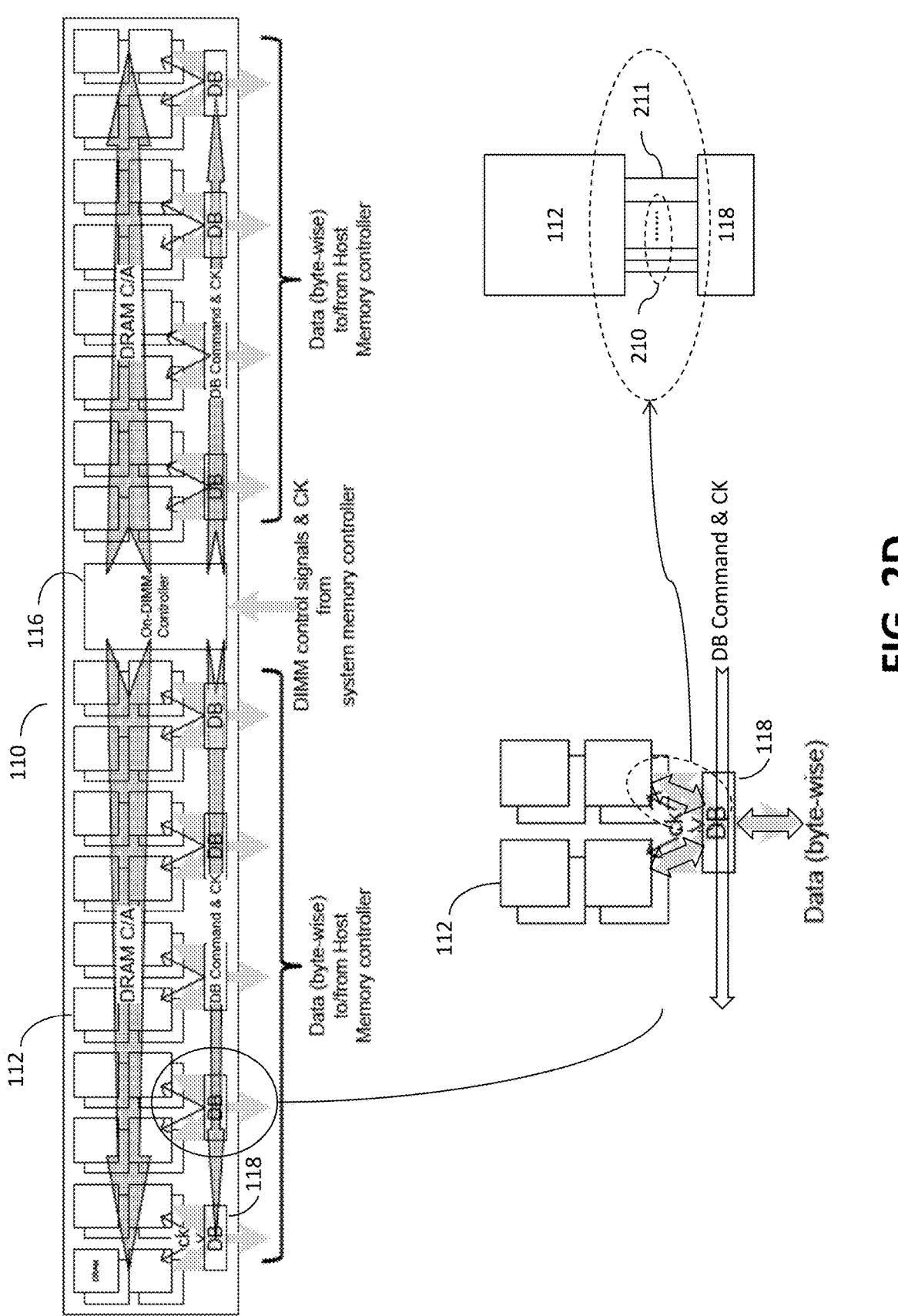

To address at least some of the above issues, in certain embodiments, as shown in FIG. 2D, the control circuit 116 transmits registered C/A signals to the memory devices 112 in a fly-by arrangement, and transmits the data buffer control signals and the registered clock signal to the data buffers 118, also in a fly-by arrangement. The memory devices 112 do not receive the registered clock signal from the control circuit 116. Instead, each data buffer 118 regenerates the clock that is used by a respective set of memory devices 112.

Each Data buffer 118 is thus responsible for providing a correct data timing interface between the respective set of memory devices 112 and the system memory controller 101. Each data buffer 118 and its associated respective set of memory devices together form a group of locally synchronized components. The date buffer 118 in each group of locally synchronized components is also responsible for providing the correct control signal timing between the control circuit 116 and the group of locally synchronized components.

Thus, the memory module 110 in FIG. 2D allows a locally synchronized operation for each group of locally synchronized components, which can correspond to a nibble or a byte of a DDR data bus between the memory module 110 and the system memory controller 101. Also, signal interface between each data buffer 118 and the respective set of memory devices 112 can be synchronized. In one embodiment, each data buffer 118 has a set of configurable operations, including, for example: programmable phase relationship between the clock it receives and the clock it regenerates, programmable phase adjustment for the data and data-strobe signals sent to the memory devices 112, programmable phase adjustment for the data and data-strobe signals sent to the system memory controller 101, and/or programmable phase adjustment for one or more control signal from the control circuit 116. The locally synchronized operation also makes it easier for each data buffer 118 to perform self-testing of the associated set of memory devices 112, independent of the self-testing of other sets of memory devices performed by the other data buffers, as disclosed in commonly-owned U.S. Pat. No. 8,001,434, issued Aug. 16, 2011, entitled "Memory Board with Self-Testing Capability," which is incorporated herein by reference in its entirety.

In certain embodiments, operations of the data buffers 118 are controlled by the data buffer control signals from the module control circuit 116, which generates the data buffer control signals according to the C/A signals received from the MCH. Thus, the data buffer control signals need to be properly received by the data buffers 118 to insure their proper operation. In one embodiment, the data buffer control signals are transmitted together with the registered clock signal, or the module clock signal CK, which is generated by the module control circuit 116 based on the system clock signal MCK. The isolation circuits 118 buffers the module clock signal, which is used to time the sampling of the data buffer control signals. Since the data buffers 118 are distributed across the memory module, the data buffer control signal lines 230 can stretch across the memory module 110, over a distance of several centimeters. As the data buffer control signals travel over such a distance, they can become misaligned with the module clock signal, resulting in metastability in the received data buffer control signals. Therefore, in one embodiment, the isolation circuits 118 includes metastability detection circuits to detect metastability condition in the data buffer control signals and signal adjustment circuits to adjust the data buffer control signals and/or the module clock signal to mitigate any metastability condition in the data buffer control signals, as disclosed in commonly-owned U.S. patent application Ser. No. 13/952,599, filed Jul. 27, 2013, entitled "Memory Module with Distributed Data Buffers and Method Of Operation," the entirety of which is incorporated herein by reference.

Because the data buffers 118 are distributed across the memory module 110, during high speed operations, it may take more than one clock cycle time of the system clock MCK for the data buffer control signals to travel along the data buffer control signals lines 230 from the module control device 116 to the farthest positioned data buffers 118, such as data buffer ID-1 and data buffer ID-(n–1) in the exemplary configuration shown in FIG. 2. In other words, a same set of data buffer control signals may reach different data buffers 118 at different times across more than one clock cycle of the system clock. For example, when the clock frequency of the system clock is higher than 800 MHZ, the clock cycle time is less than about 1.2 ns. With a signal travel speed of about 70 ps per centimeter of signal line, a data buffer control signal would travel about 15 cm during one clock cycle. When the clock frequency increases to 1600 MHZ, a data buffer control signal would travel less than 8 cm during one clock cycle. Further, a data buffer control signal line can have multiple data buffer control signals on the line at the same time. Thus, before one data buffer control signal reaches an end of the signal line, another data buffer control signal can appear on the same signal line.

With the data buffers 118 receiving data buffer control signals at different times across more than one clock cycle, the data buffer control signals alone are not sufficient to time the transmission of read data signals to the MCH 101 from the data buffers 118. In one embodiment, the data buffers have programmable control of the timing of read/write data signals and the phase of the locally synchronized clock signal for each group of locally synchronized devices. In certain embodiments, each data buffer can further determine individually, during a write operation, a time interval between a time when one or more data buffer control signals are received from the module control circuit 116 and a time when a write strobe or write data signal is received from the MCH 101. This time interval is used to adjust the timing of the transmission of read data to the MCH 101 during a subsequent read operation, as explained in more detail below.

More illustrative information will now be set forth regarding various optional configurations, architectures, and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 3:
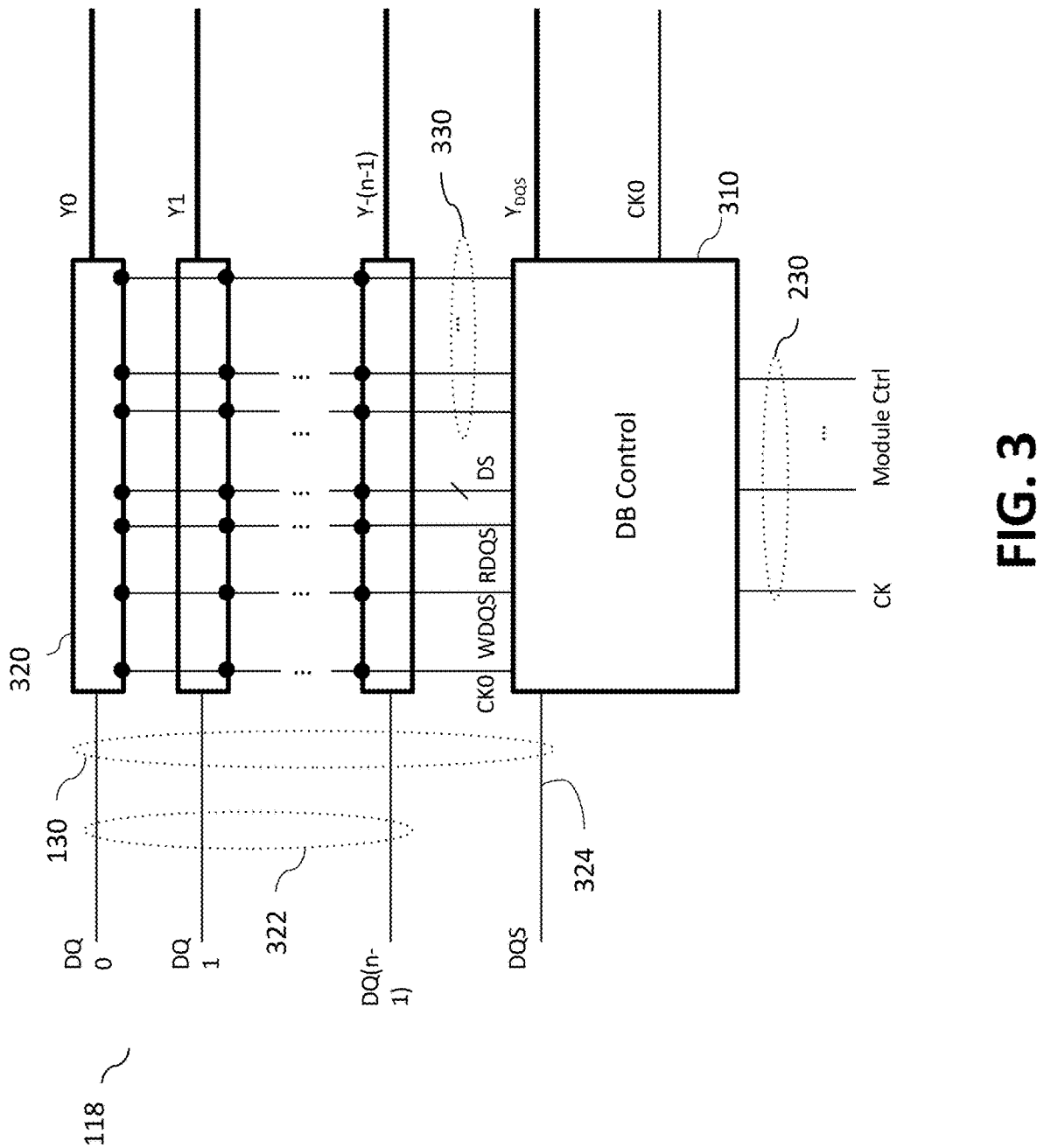
FIG. 3 is a diagram illustrating one of a plurality of data buffers in a memory module according to one embodiment.

In one embodiment, as shown in FIG. 3, each group of signal lines 130 include a set of n data (DQ) signal lines 322 each for transmitting one of a set of bits $DQ_0$, $DQ_1$, . . . , $DQ_{n-1}$, in a data signal and at least one strobe (DQS) signal line 324 for transmitting at least one strobe signal DQS. Each set of module data/strobe lines Y include a set of n module data signal lines $Y_0$, $Y_1$, . . . , $Y_{n-1}$ and at least one module strobe signal line $Y_{DQS}$. When the subsets of memory devices are coupled to the associated data buffer 118 via respective subsets of memory devices, each set of module data/strobe lines Y may include multiple subsets of module data/strobe lines, such as the subsets of module data/strobe lines YA and YB shown in FIG. 2B. Each subset of module data/strobe lines YA include a set of n first module data lines $YA_0$, $YA_1$, . . . , $YA_n$ and at least one first module strobe signal line $YA_{DQS}$; and each subset of module data/strobe lines YB include a set of n second module data lines $YB_0$, $YB_1$, . . . , $YB_n$ and at least one second module strobe signal line $YB_{DQS}$.

Each data buffer 118 includes a set of DQ routing circuits 320 coupled on one side to respective ones of the set of n DQ signal lines 322, and on another side to respective ones of the respective set of n module data lines, or respective ones of the respective subsets of module data lines, such as the first module data lines $YA_0$, $YA_1$, . . . , $YA_n$ and the second module data lines $YB_0$, $YB_1$, . . . , $YB_n$. Each data buffer 118 further includes an DB Control circuit 310 coupled on one side to the at least one DQS signal line 324, on another side to the one or more module strobe signal lines $Y_{DQS}$, or the first module strobe signal line $YA_{DQS}$ and second module strobe signal line $YB_{DQS}$.

The DB Control circuit 310 also receives the module clock signal CK and the data buffer control signals via the data buffer control signal lines 230, and outputs datapath control signals 330 to the DQ routing circuits 320, including, for example, one or more enable signals ENA and/or ENB, and some or all of the other received, decoded, and/or otherwise processed data buffer control signals. In certain embodiments, the DB Control circuit 310 also outputs one or more delay signals DS, a read DQS signal RDQS, a write DQS signal WDQS, and a buffer clock signal CK0. Each DQ routing circuit 320 is configured to enable data communication between the respective DQ signal line 322 with a selected subgroup of one or more memory devices in response to the data buffer control signals, as explained in more detail below.

In certain embodiments, the DB Control circuit 310 also provides one or more delay signals DS, which is used by the DQ routing circuits 320 to control the timing of read and/or write data output by the data buffer 118, as explained in further detail below. In certain embodiments, the DB Control circuit 310 regenerates clock signal CK0 from the module clock signal CK. In certain embodiments, the regenerated clock signal CK0 is phase-locked to the module clock signal CK. In certain embodiments, the regenerated clock signal CK0 has a programmable delay from the module clock signal CK. In certain embodiments, the regenerated CK0 is provided to the respective group of memory devices so that the data buffer 118 and the respective group of memory devices form a group of locally synchronized devices on the memory module 110.

Figure 4A:
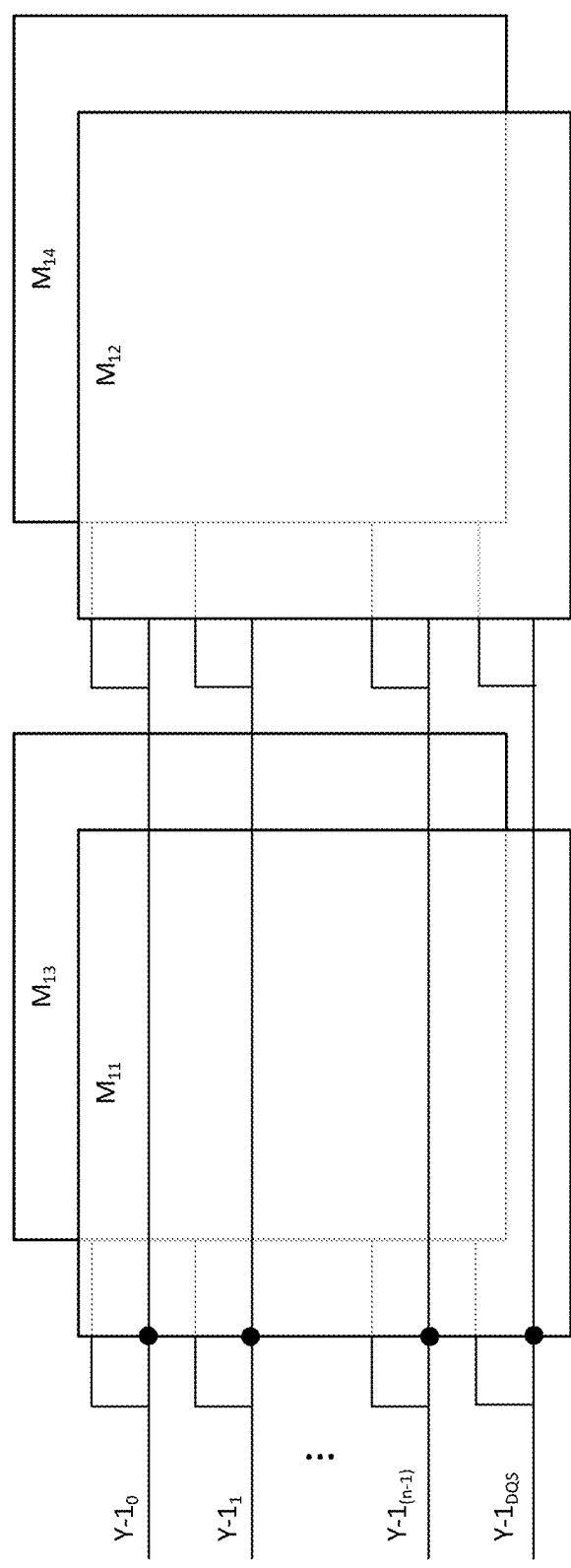
FIGS. 4A-4B are each a diagram illustrating data and data strobe signal lines coupled to memory devices in a memory module according to certain embodiments.

The memory devices 112 in each group of locally synchronized devices are coupled to the data buffer 118 in the each group of locally synchronized devices via a same set of module data/strobe signal lines. Or the memory devices 112 in each group of locally synchronized devices include subgroups of memory devices that are coupled to the data buffer 118 via different subsets of module data/strobe signal lines. For example, as shown in FIG. 4A, memory devices $M_{11}$, $M_{12}$, $M_{13}$, and $M_{14}$ in the first group of memory devices can be coupled to the data buffer ID-1 via a same set of module data lines $Y\text{-}1_0$, $Y\text{-}1_1$, . . . , $Y\text{-}1_{n-1}$ and module strobe line $Y\text{-}1_{DQS}$. In such embodiment, a subgroup in the group of memory devices can be selected by the data buffers to communicated data with the MCH based on the phases of the data/strobe signals, which can be different with respect to different subgroups of memory devices.

Figure 4B:
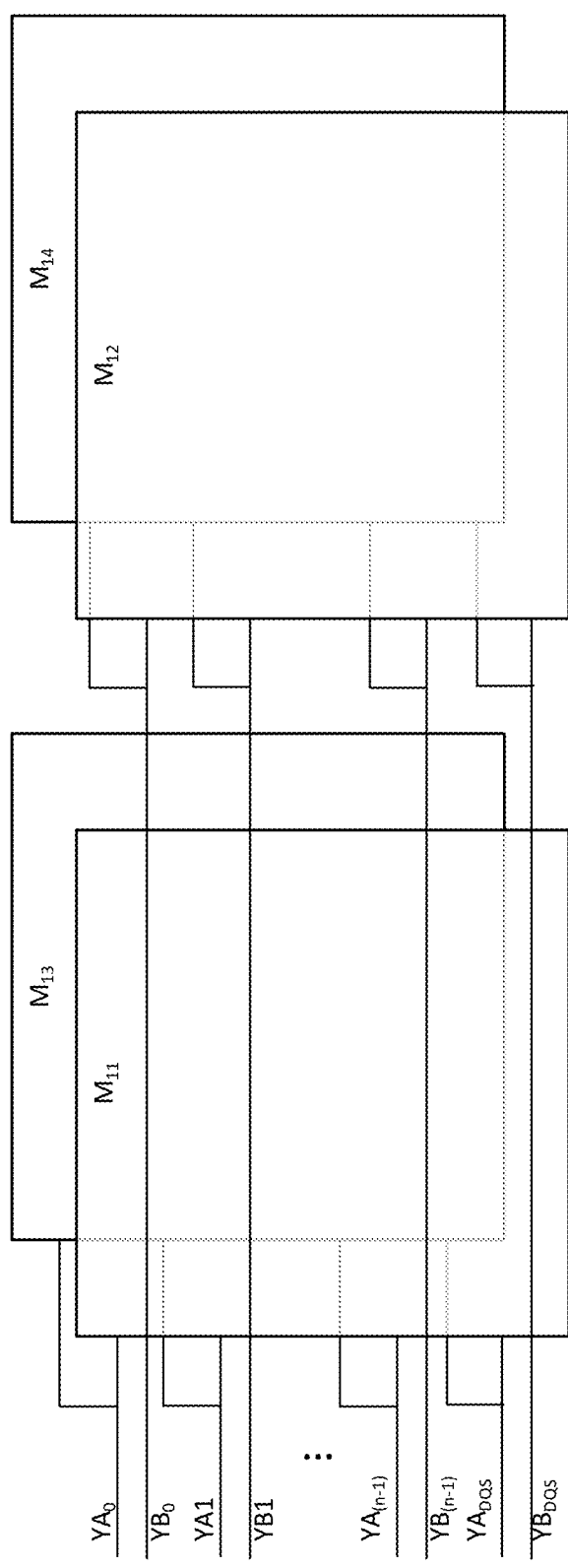

Alternatively, as shown in FIG. 4B, memory devices $M_{11}$ and $M_{13}$, which form a subgroup in the first group of memory devices, are coupled to the data buffer ID-1 via the module data lines $YA\text{-}1_0$, $YA\text{-}1_1$, . . . , $YA\text{-}1_n$ and module strobe line $YA\text{-}1_{DQS}$ and memory devices $M_{12}$ and $M_{14}$, which form another subgroup in the first group of memory devices, are coupled to the data buffer ID-1 via the module data lines $YB\text{-}1_0$, $YB\text{-}1_1$, . . . , $YB\text{-}1_n$ and module strobe line $YB\text{-}1_{DQS}$. Memory devices coupled to the same data buffers can be disposed on a same side or different sides of the memory board 119. Memory devices coupled to the same data buffers may be placed side-by-side, on opposite sides of the module boards 119, or stacked over each other, and/or over the associated data buffer.

Multiple memory devices having a data width that is less than a data width of the data buffers 118 may be used in place of one of the memory devices 112, which has the same data width as that of the data buffers. For example, as shown in FIG. 5A, two memory devices $M_{11\text{-}1}$ and $M_{11\text{-}2}$ may be used in place of the memory device $M_{11}$. Each of the two memory devices $M_{11\text{-}1}$ and $M_{11\text{-}2}$ has a data width of 4, and together they act like a memory device $M_{11}$ of a data width of 8. Thus, memory device $M_{11\text{-}1}$ is coupled to the data buffer ID-1 via module data lines $YA\text{-}1_0$, . . . , $YA\text{-}1_3$ and module strobe line $YA\text{-}1_{DQS\text{-}1}$ while memory circuit $M_{11\text{-}2}$ is coupled to the data buffer ID-1 via module data lines $YA\text{-}1_4$, . . . , $YA\text{-}1_7$ and module strobe line $YA\text{-}1_{DQS\text{-}2}$.

Figure 5B:
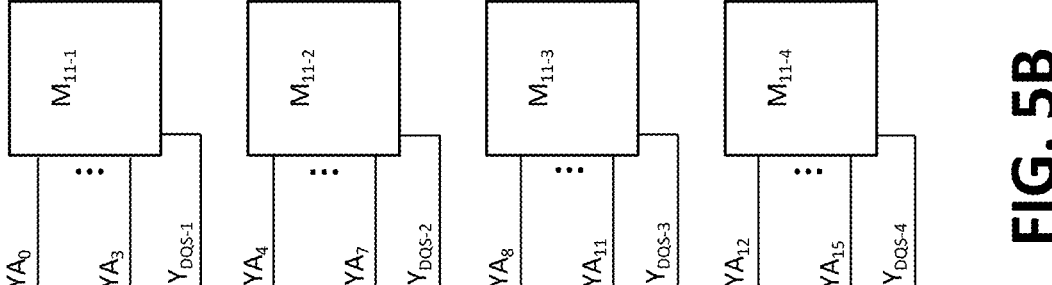
FIGS. 5A-5B are diagrams illustrating different numbers of memory devices that can be coupled to each data buffer in a memory module according to certain embodiments.
Figure 5A:
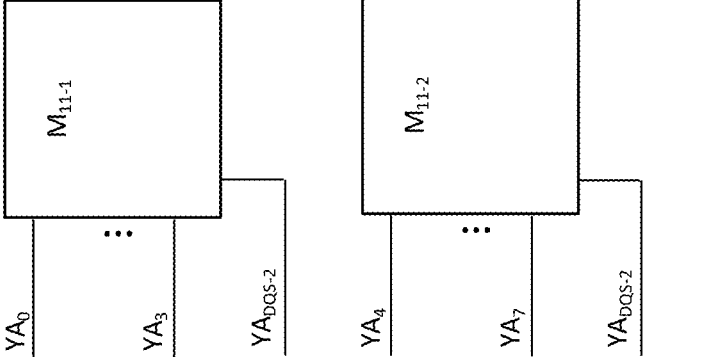

In another embodiment, as shown in FIG. 5B, four memory devices $M_{11\text{-}1}$ to $M_{11\text{-}4}$ may be used as the memory device $M_{11}$. Each of the four memory devices $M_{11\text{-}1}$ to $M_{11\text{-}4}$ has a data width of 4, and together they act like a memory device $M_{11}$ of a data width of 16. Thus, memory device $M_{11\text{-}1}$ is coupled to the data buffer ID-1 via module data lines $YA\text{-}1_0$, . . . , $YA\text{-}1_3$ and module strobe line $YA\text{-}1_{DQS\text{-}1}$ while memory device $M_{11\text{-}2}$ is coupled to the data buffer ID-1 via module data lines $YA\text{-}1_4$, . . . , $YA\text{-}1_7$ and module strobe line $YA\text{-}1_{DQS\text{-}2}$, and so on.

Figure 6A:
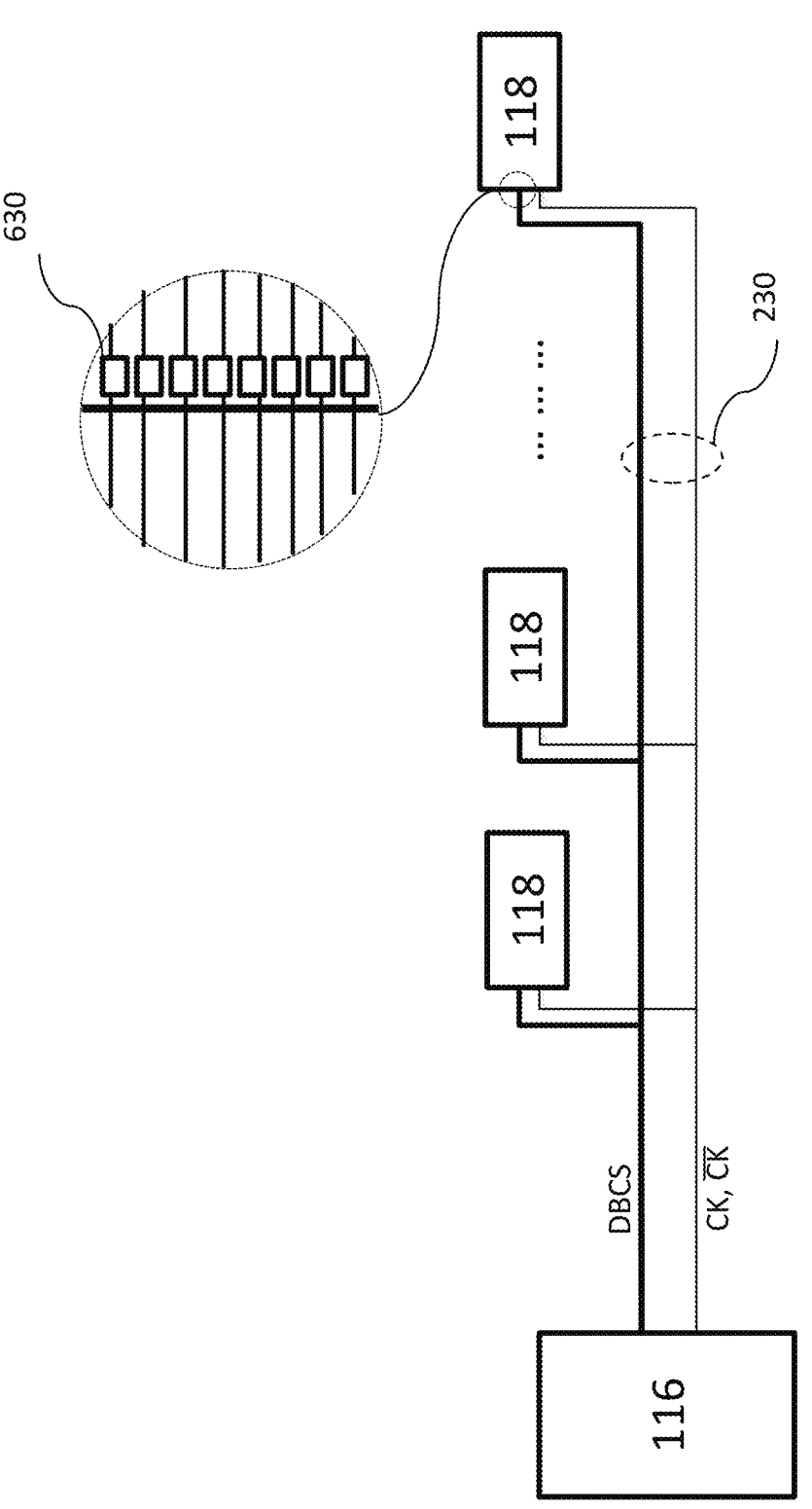
FIG. 6A is a diagram illustrating data buffer control signals from a module control device to a plurality of data buffers in a memory module according to certain embodiments.

FIG. 6A is a diagram illustrating clock signals and data buffer control signals from a module control device to a plurality of data buffers in a memory module according to certain embodiments. As shown, the data buffer control signals may include, for example, eight signals received respectively by eight signal receiving circuits 630 on each data buffer. In certain embodiments, one or more of the eight signals are to specify a mode of operation (e.g., normal operation, configuration or test mode). The definitions of the other data buffer control signals are different in different modes of operation. For example, in the configuration mode, the module control circuit 116 uses the DBCS to configure the programmable features in the data buffers 118 based on configuration information received from the MCH 101; in the test mode, the DBCS is used to control the self-test processes run by the data buffers; in the normal operation mode, the DBCS includes the one or more enable signals and one or more ODT signals.

Figure 6B:
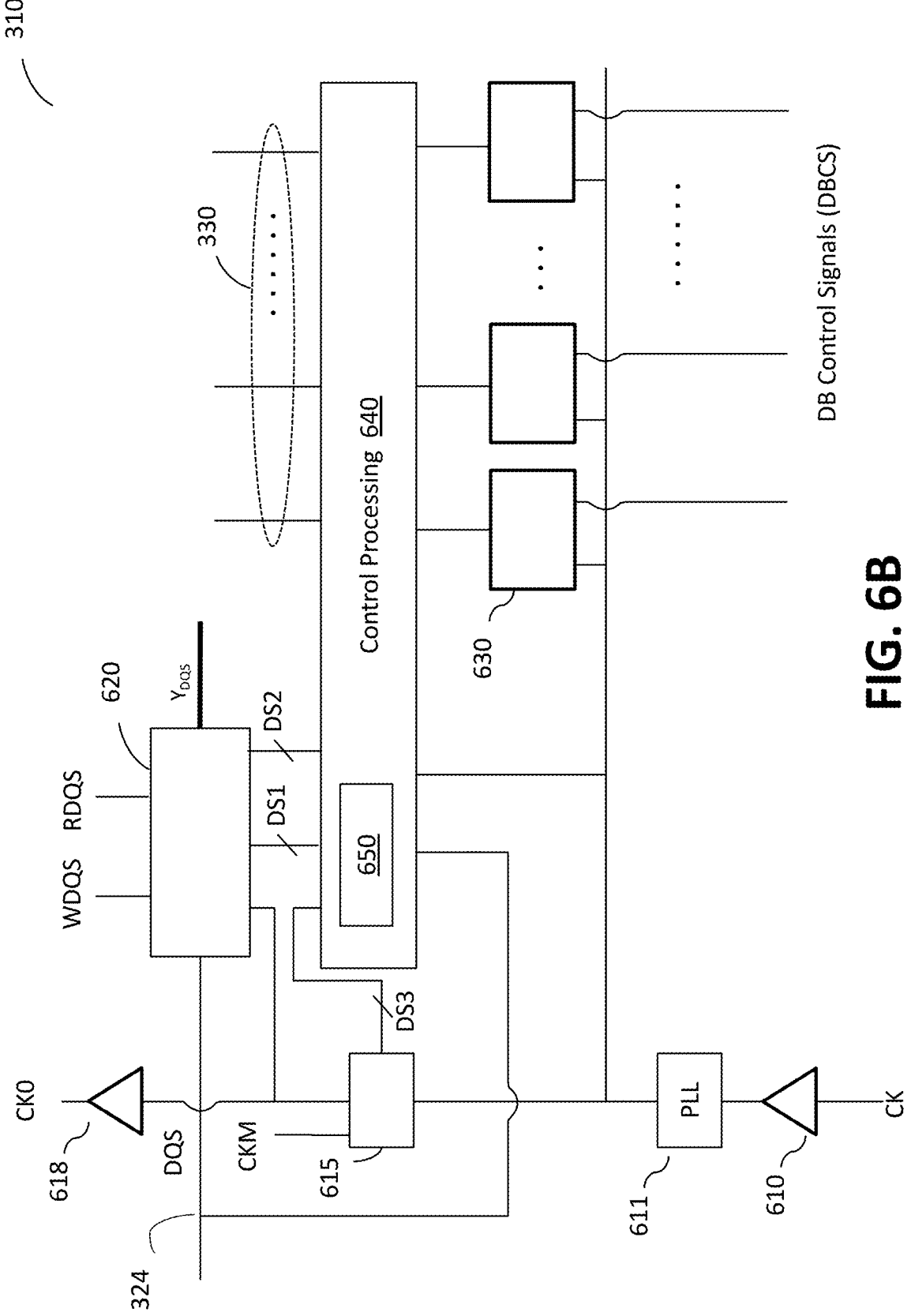
FIG. 6B is a diagram illustrating a control circuit in a data buffer according to certain embodiments.

FIG. 6B illustrates the DB Control circuit 310 in an data buffer 118. As shown, the DB Control circuit 310 includes a clock buffer 610 to receive the module clock signal CK from the module control device 116, a phase-locked loop circuit (PLL) 611 that provides phase locking between the input clock CK and the locally synchronized clock CK0, a clock phase adjustment circuit 615 for adjusting the phase of the locally synchronized clock CK0, and a clock driver 618 that drives the locally synchronized clock CK0 to the corresponding group of memory devices. The DB Control circuit 310 further includes a strobe routing circuit 620 that are coupled on one side to a corresponding system DQS signal line 324 and on another side to corresponding module DQS signal lines $YA_{DQS}$ and $YB_{DQS}$. The DB Control circuit 310 further includes receiver circuits 630 to receive respective ones of the DBCS.

The DB Control circuit 310 further includes a control processing circuit 640 that decodes and/or otherwise processes the data buffer control signals. In the normal operation mode, the decoded/processed data buffer control signals may include, for example, one or more data path enable signals ENA and/or ENB that are used by the DQ routing circuits 320 and the strobe routing circuit 620 to selectively enabling data communication between the MCH 101 and one of the subgroups in the respective group of memory devices, with which the data buffer is associated. In a configuration mode, the decoded/processed data buffer control signals are used to program configuration registers in the control processing circuit 640, which in turn control one or more delay signals DS1, DS2, DS3. The delay signal DS1 is used to control delay circuits in the read paths in the DQ/DQS routing circuits, the delay signal DS2 is used to control delay circuits in the write paths in the DQ/DQS routing circuits the data buffer, and the delay signal DS3 is used to control the phase of the locally synchronized clock CK0.

The strobe routing circuit 620 also buffers strobe signals received from either the MCH 101 or the memory devices 112, and outputs either a write strobe WDQS or read strobe RDQS, respectively, to the DQ routing circuits 320. In one embodiment, the DB Control circuit 310 further includes a dynamic delay control circuit 650 that provide dynamic adjustment of the timing of read data/strobe signals in the DQ routing circuit 320 and the strobe routing circuit 620.

Figure 6C:
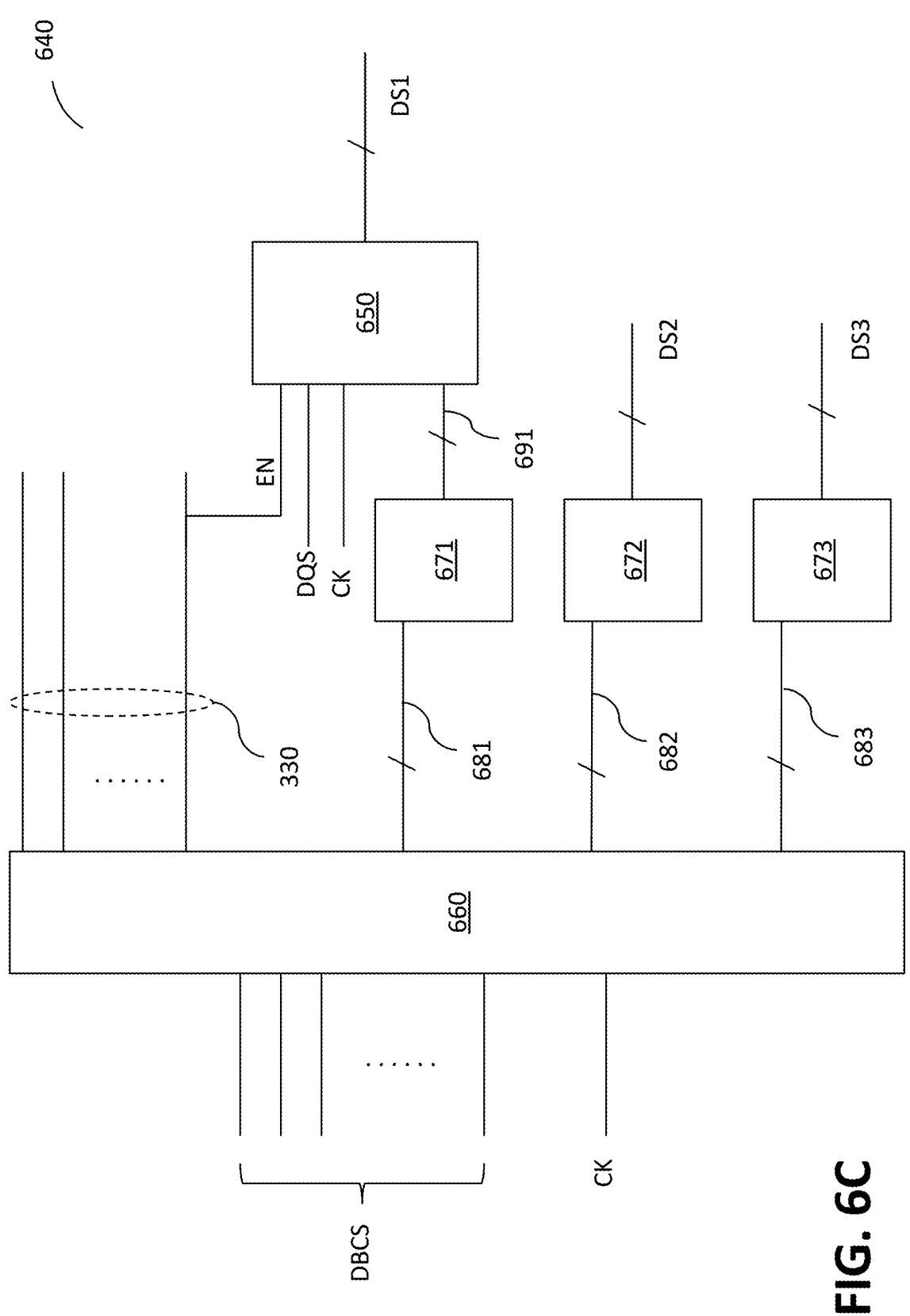
FIG. 6C is a diagram illustrating a control processing circuit in a data buffer according to certain embodiments.

In certain embodiments, as shown in FIG. 6C, the control processing circuit 640 includes control logic 660 that receives the data buffer control signals and the module clock signal CK and outputs in the normal operation mode the data path control signals 330. In a configuration mode, the control logic outputs configuration signals for programming configuration registers in the data buffer. For example, the control logic outputs configuration signals 681 to programmable registers 671 that provides static control of the timing of read data/strobe signals, configuration signals 682 to programmable registers 671 that controls the delay signals DS2, which used to control the timing of write data/strobe signals, and configuration signals 683 to programmable registers 673 that controls the delay signals DS3, which is used to control the phase of the locally synchronized clock signal CK0.

The programmable registers 671 is coupled via signal lines 691 to the dynamic delay control circuit 650, which also takes as input a DQS signal, clock signal CK, and one of the data path enable signals EN, and output the delay signal DS1. The dynamic delay control circuit 650 is described in further detail below.

FIG. 7A is a flowchart illustrating a method 700 performed by the memory module 110 according to certain embodiments. As shown in FIG. 7A, the method includes receiving 710 clock signal together with system C/A signals from the MCH 101, and generating 715 module clock signal CK. The module clock signal CK is transmitted 720 to a plurality of distributed data buffers 118, which generates 725 locally synchronized clock signals CK0 for each group of locally synchronized devices. Each data buffer then transmits 730 its locally synchronized clock signals CK0 to the memory devices corresponding to the each data buffer, and the memory devices perform 735 memory operations in accordance with the respective locally synchronized clock signals.

Since the module control circuit 116 generates the DBCS based on signals from the MCH 101, the MCH 101 can train the data buffers 118 to properly time the read/write data signals and to properly adjust the phase of the locally synchronized clock signals CK0. In certain embodiments, the module control circuit 116 generates the DBCS for setting the registers in the delay control circuit based on mode register command signals from the MCH 101. As shown in FIG. 7B, a method 750 for training the data buffers to provide a proper amount of phase shift to the locally synchronized clock signals CK0 includes performing a write operation by writing 751 data to a set of memory locations in the memory devices 112, which is followed by performing a read operation by reading 752 data from the set of memory locations. The read data is compared 753 with the write data to determine 754 if phase adjustment is needed for each locally synchronized clock signals CK0. For example, if the read data bits from data signal lines closer to the module control circuit 116 agree with the corresponding write data bits, while read data bits from the data signal lines further away from the module control circuit 116 do not agree with the corresponding write data bits. The disagreement is likely caused by the locally synchronized clock signals CK0 in the data buffers 118 further away from the module control circuit 116 being excessively delayed during transmission, and proper phase adjustment can be programmed 755 into the data buffers to add a phase-shift to the clock signals CK0 to compensate the skew among the data buffers. The programming can be done using, for example, a mode register write operation. The above process can be repeated until proper clock signal phase adjustment is achieved.

Figure 8:
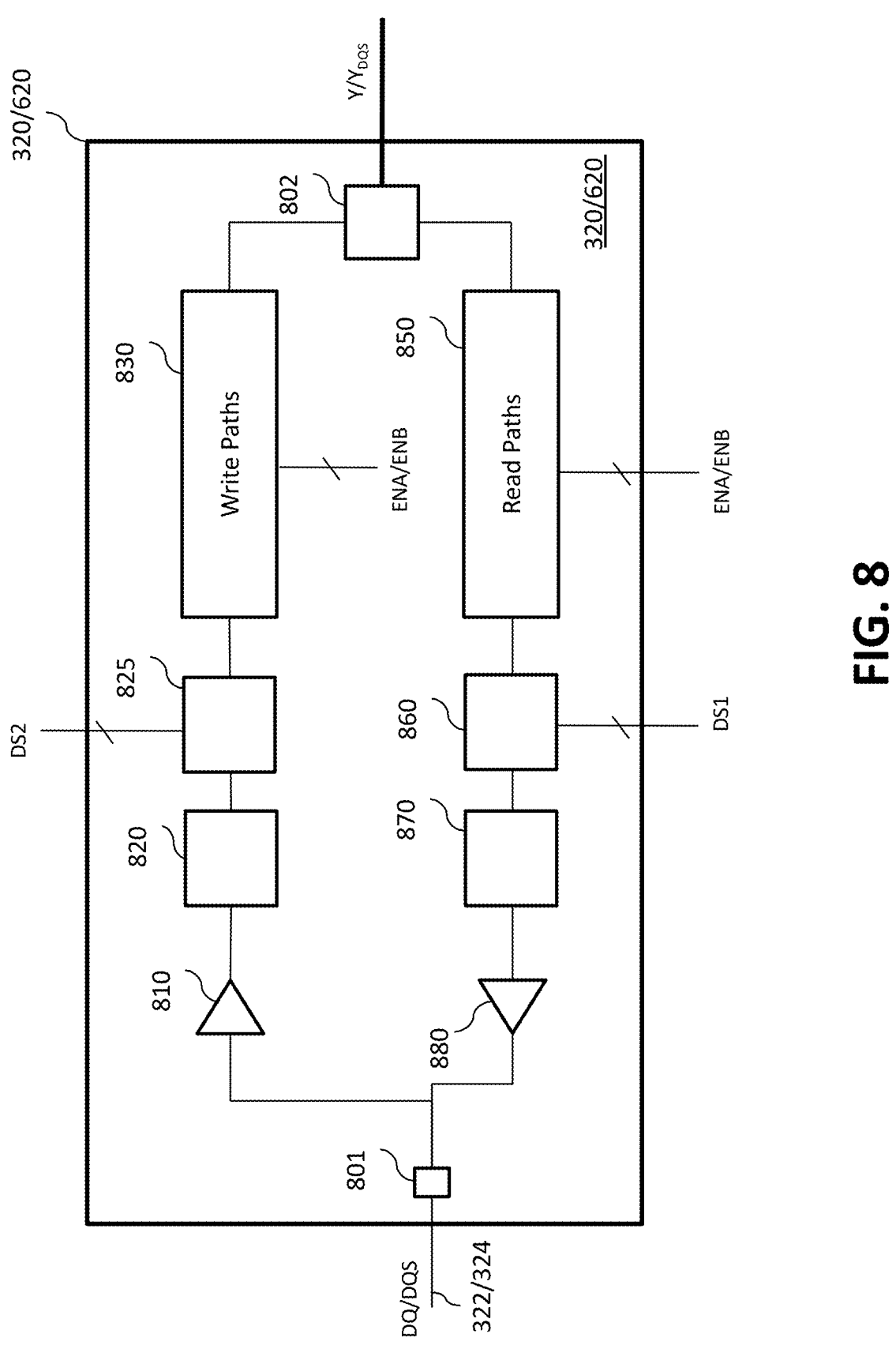
FIG. 8 is a diagram illustrating a DQ or DQS routing circuit in a data buffer according to an embodiment.

FIG. 8 illustrates a DQ or DQS routing circuit 320 or 620 according to an embodiment. As shown, the DQ/DQS routing circuit 320/620 includes a DQ/DQS pin 801 that is coupled to the corresponding DQ/DQS signal line 322/324, a set of one or more DQS pins 802 that is coupled to a corresponding module DQ/DQS line(s) Y/Y$_{DQS}$, or YA/YA$_{DQS}$ and YB/YB$_{DQS}$. The DQ/DQS routing circuit 320/620 further includes a write strobe buffer 810 that buffers write data/strobe, a write data/strobe receiver 820 that samples the write data/strobe, and a write delay circuit 825 controlled by the delay signal DS2. The DQ/DQS routing circuit 320/620 further includes a plurality of write paths 830 that are selectable or can be selectively enabled by one or more of the data buffer control signals, such as the enable signals ENA and ENB.

The DQS routing circuit further includes a plurality of read paths 850 that are selectable in accordance with the one or more of the data buffer control signals. Output from the selected read path is delayed in a delay circuit 860 by an amount controlled by the delay signal DS1, and sampled by a sampler circuit 870. The sampled read data/strobe is transmitted by transmitter 880 onto the corresponding data/strobe signal line 322/324 via the DQ/DQS pin 801.

Figure 9:
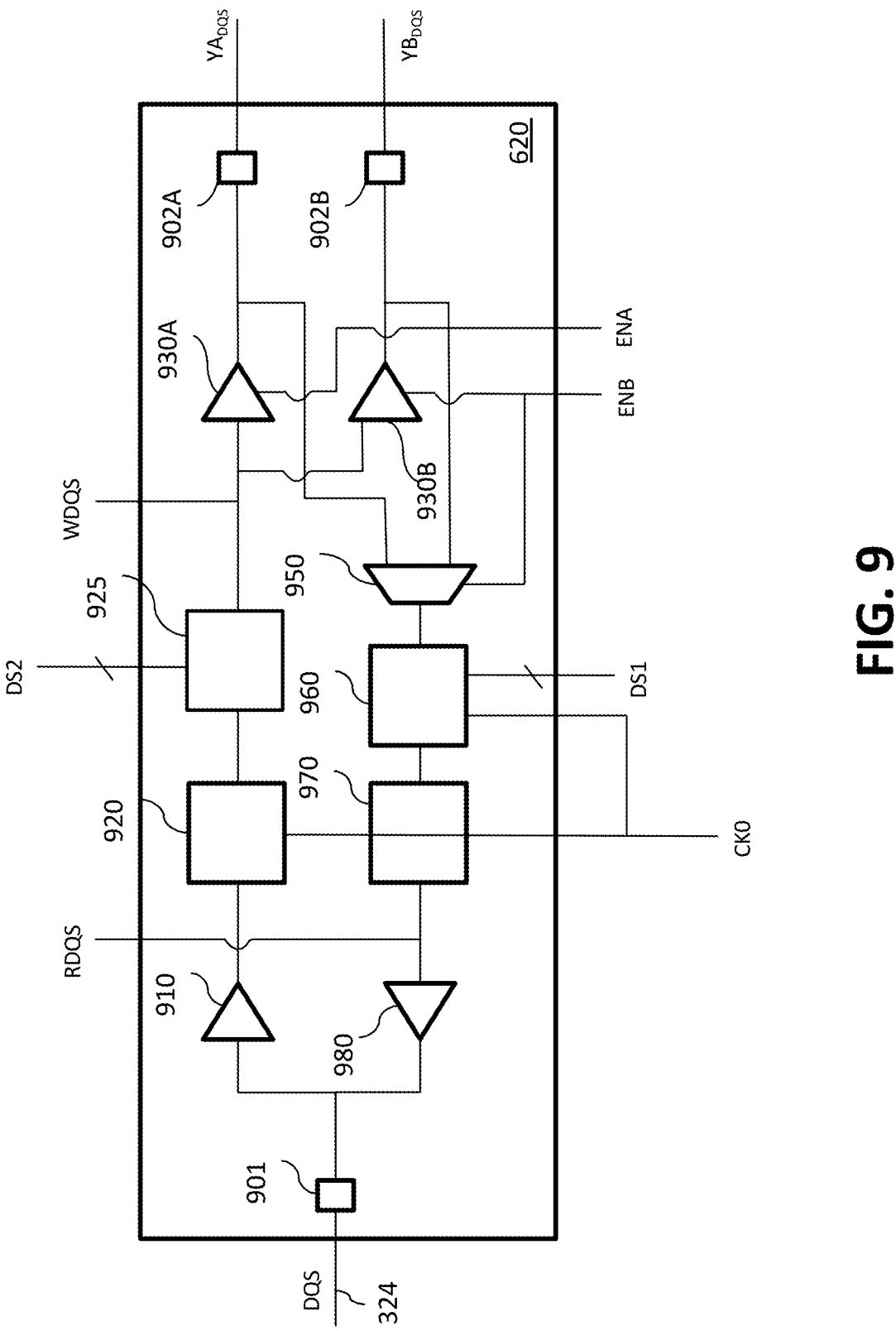
FIG. 9 a diagram illustrating a DQS routing circuit having a delay circuit in a data buffer according to an embodiment.

FIG. 9 illustrates a DQS routing circuit 620 according to an embodiment. As shown, the DQS routing circuit 620 includes a first DQS pin 901 that is coupled to a corresponding DQS signal line 324, a second DQS pin 902A that is coupled to a corresponding module DQS line YA$_{DQS}$, a third DQS pin 902B that is coupled to a corresponding module DQS line YB$_{DQS}$. The DQS routing circuit 620 further includes a first write strobe path coupled between the first DQS pin 901 and the second DQS pin 902A and a second write strobe path coupled between the first DQS pin 901 and the third DQS pin 902B. The first write strobe path includes a write strobe buffer 910 that buffers a write strobe, a write strobe receiver 920 that samples the write strobe according to the buffered module signal CK0 and a write delay circuit 925 controlled by the delay signal DS2. The sampled write strobe is provided to the DQ routing circuits 320 as the write strobe WDQS. The first write strobe path further includes a first write strobe transmitter 930A that transmits the write strobe to one or more memory devices 112 coupled to the module strobe line YA$_{DQS}$. The second write strobe path includes the write strobe buffer 910, the write strobe receiver 920, the write delay circuit 825 controlled by the delay signal DS2, and a second write strobe transmitter 930B that transmits the write strobe to one or more memory devices 112 coupled to the module strobe line YB$_{DQS}$. The first and second write strobe transmitters, 930A and 930B, are controlled by two enable signals, ENA and ENB, respectively, such that the first write strobe path and the second write strobe path can be selectively enabled/disabled by the enable signals, ENA and ENB.

The DQS routing circuit further includes a read strobe path coupled between the first DQS pin 901 and a selected one of the second and third DQS pins 902A and 902B. In the read strobe path, a select circuit 950 (e.g., a multiplexor) selects either a read strobe signal received via DQS pin 902A or a read strobe signal received via DQS pin 902B based on one or both of the enable signals ENA or ENB. The selected read strobe signal is delayed in a delay circuit 960 by an amount controlled by the delay signal DS, and sampled by a sampler circuit 970 according to the buffered module clock signal CK0. The sampled read strobe is provided to the DQ routing circuits 320 as the read strobe RDQS and is transmitted by transmitter 980 onto the corresponding strobe signal line 324 via the first DQS pin 901.

Figure 10:
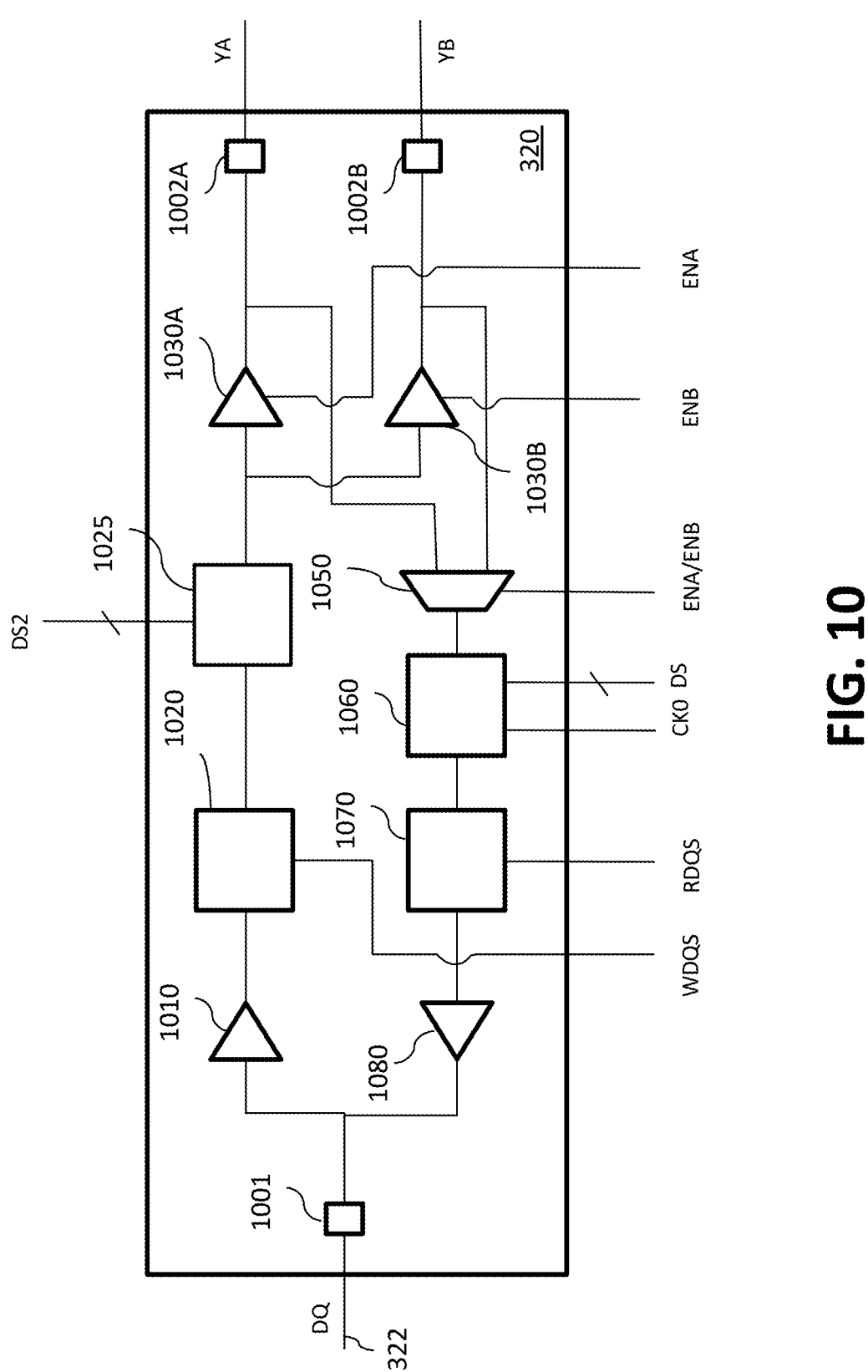
FIG. 10 a diagram illustrating a DQ routing circuit having a delay circuit in a data buffer according to an embodiment.

FIG. 10 illustrates a DQ routing circuit 320 according to an embodiment. As shown, the DQ routing circuit 320 includes a first DQ pin 1001 that is coupled to a corresponding DQ signal line 130, a second DQ pin 1002A that is coupled to a corresponding module DQ line $YA_{DQ}$, a third DQ pin 1002B that is coupled to a corresponding module DQ line $YB_{DQ}$. The DQ routing circuit 320 further includes a first write data path coupled between the first DQ pin 1001 and the second DQ pin 1002A and a second write data path coupled between the first DQ pin 1001 and the third DQ pin 1002B. The first write data path includes a write data buffer 1010, a write data receiver 1020 that samples write data according to the write strobe WDQS from the DQS routing circuit 620, a write delay circuit 1025 controlled by the delay signal DS2, and a first write data transmitter 1030A that transmits the write data to one or more memory devices 112 coupled to the module data line $YA_{DQ}$. The second write data path includes the write data buffer 1010, the write data receiver 1020, the write delay circuit 825 controlled by the delay signal DS2, and a second write data transmitter 1030B that transmits the write data to one or more memory devices 112 coupled to the module data line $YB_{DQ}$. The first and second write data transmitters, 1130A and 1130B, are controlled by two enable signals, ENA and ENB, respectively. Thus, the first write data path and the second write data path can be selectively enabled/disabled by the enable signals, ENA and ENB.

The DQ routing circuit further includes a read data path coupled between the first DQ pin 1001 and a selected one of the second and third DQ pins 1002A and 1002B. In the read data path, a select circuit 1050 (e.g., a multiplexor) selects either a read data signal received via DQ pin 1002A or a read data signal received via DQ pin 1002B based on one or both of the enable signals ENA or ENB. The selected read data signal is delayed in a delay circuit 1060 by an amount controlled by the delay signal DS. The delayed read data signal is then sampled by a receiver circuit 1070 according to the read strobe RDQS from the DQS routing circuit 620, and transmitted by transmitter 1080 onto the corresponding data signal line 130 via the first DQ pin 1001.

Figure 11:
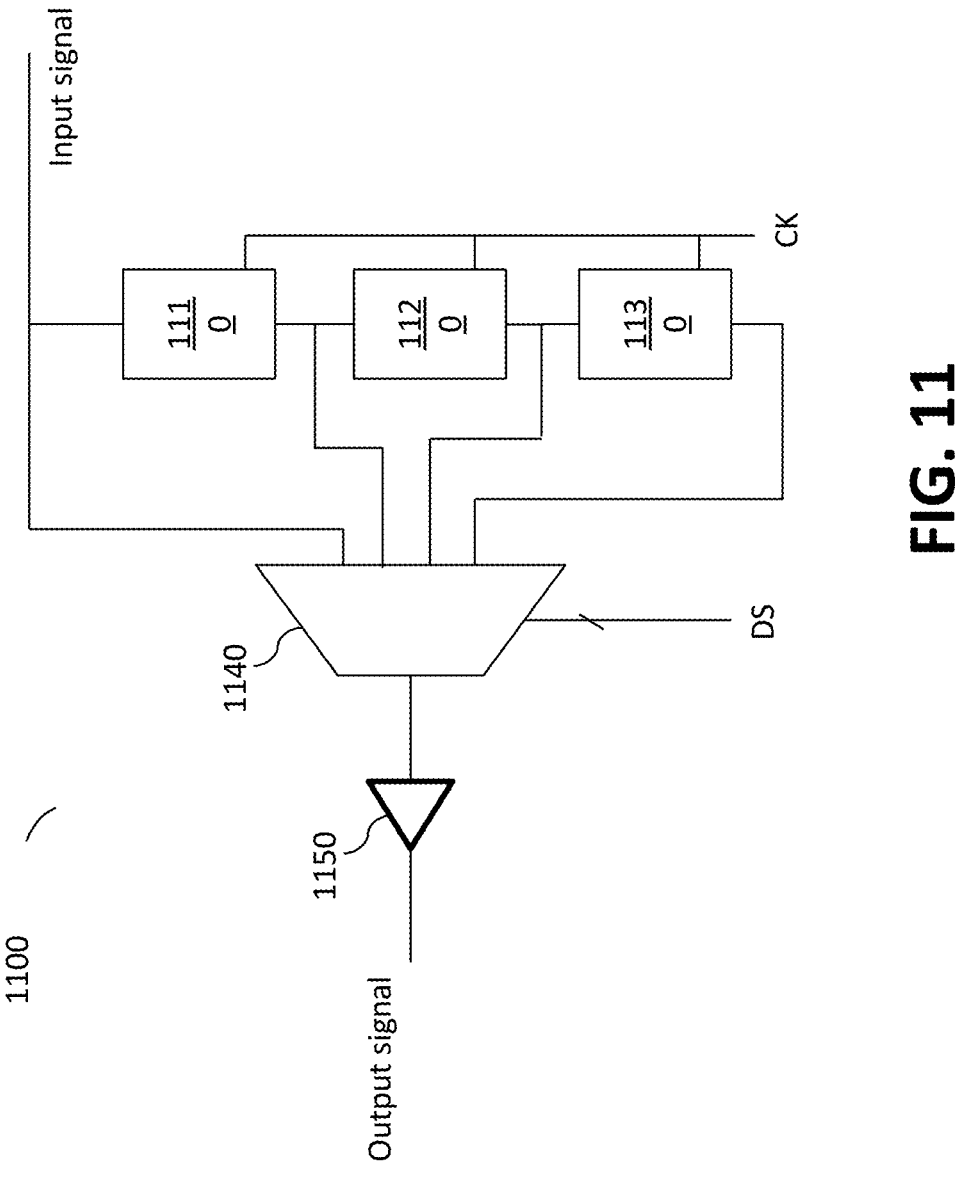
FIG. 11 is a diagram illustrating a delay circuit in a DQ or DQS routing circuit according to an embodiment.

FIG. 11 illustrate a delay circuit 1100 that can be used as the delay circuit 825/860/925/960/1025/1060 according to an embodiment. As shown, the delay circuit 1100 includes a plurality of delay stages, such as delay stages 1110, 1120, and 1130, each delaying an input signal by a predetermined amount. The delay circuit 1100 further includes a select circuit 1140 (e.g., a multiplexor) that selects from among the outputs from the delay stages according to the delay signal DS (DS1, DS2, or DS3) it receives. The output of the select circuit is thus delayed from the input signal by an amount controlled by the delay signal DS.

As stated above, the MCH 101 can control the timing of read/write signals by programming the registers that control the DS1 and DS2 signals. However, since the data buffers 118 are in the data paths between the MCH 101 and the respective groups of memory devices 112, the MCH 101 does not have direct control of the interface between the data buffers and the memory devices 112. Thus, conventional read/write leveling techniques are not sufficient for managing read/write data timing. In one embodiment, in addition to the data buffers 118 having programmable control of timing of the read/write signals and the phase of the clock signal for each group of locally synchronized components, the data buffers also include signal alignment mechanism to dynamically control the timing of the transmission of read data/strobe signals, as discussed further below.

Figure 12A:
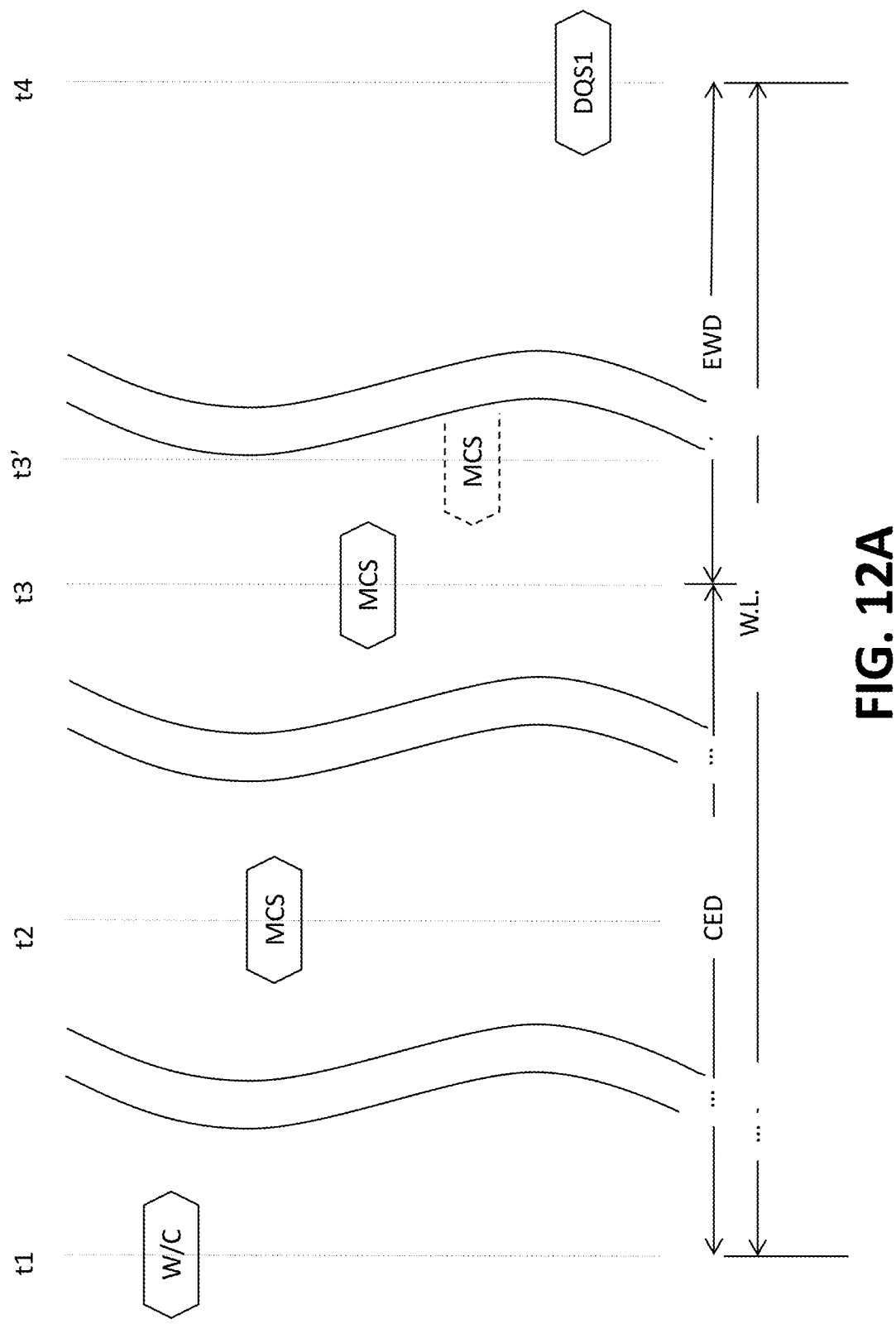
FIGS. 12A and 12B are timing diagrams associated with a write operation and a read operation, respectively, performed by a memory module according to one embodiment.

FIG. 12A is a timing diagram for a write operation according to one embodiment. As shown, after a write command W/C associated with the write operation is received by the module control circuit 116 at time t1, the module control circuit 116 outputs one or more enable signals EN at time t2 in response to the write commands. The one or more enable signals are received by a data buffer 118 at time t3, which afterwards receives one or more strobe signal DQS from the MCH 101 at time t4. Note that the same enable signal may be received by another data buffer 118 at time t3', which can be in a different cycle of the system clock MCK from the cycle in which t3 is in. The time interval between t4 and t1 is consistent with a write latency W.L. associated with the system 100, and is controllable by the MCH 101 and knowable to the data buffer 118. The time interval between t4 and t3, referred to hereafter as an enable-to-write data delay EWD, can be determined by the data buffer 118 since both these signals are received by the data buffer. Based on such determination, the data buffer 118 can have knowledge of the time interval between t3 and t1, referred to hereafter as a command-to-enable delay CED, which can be used by the data buffer 118 to generate an adjusted clock signal and to properly time transmission of read data to the MCH, as explained further below.

Figure 12B:

FIG. 12B is a timing diagram for a read operation according to one embodiment. As shown, after a read command R/C associated with the read operation is received by the module control circuit 116 at time t5, the module control circuit 116 outputs one or more enable signals EN at time t6 in response to the read commands. The one or more enable signals are received by an data buffer 118 at time t7, which outputs at time t8 read data signals (not shown) and one or more strobe signal DQS received from the respective group of memory devices. Note that the same enable signal may be received by another data buffer 118 at time t3', which can be in a different cycle of the system clock MCK from the cycle which t3 is in. Thus, the enable signals alone cannot be used to time the transmission of the read signals by the data buffers 118.

With knowledge of the time interval between t7 and t5, which should be about the same as the time interval between t3 and t1, i.e., the command-to-enable delay CED, in certain embodiments, the data buffer can add a proper amount of delay to the read data signals and the one or more DQS signal such that the read data signals and the one or more DQS signal are transmitted at time t9 by the data buffer to the MCH 101 via the respective group of data/strobe signal lines 130, with the time interval between t9 and t5 being consistent with a read latency R.L. associated with the system 100.

Figure 13:
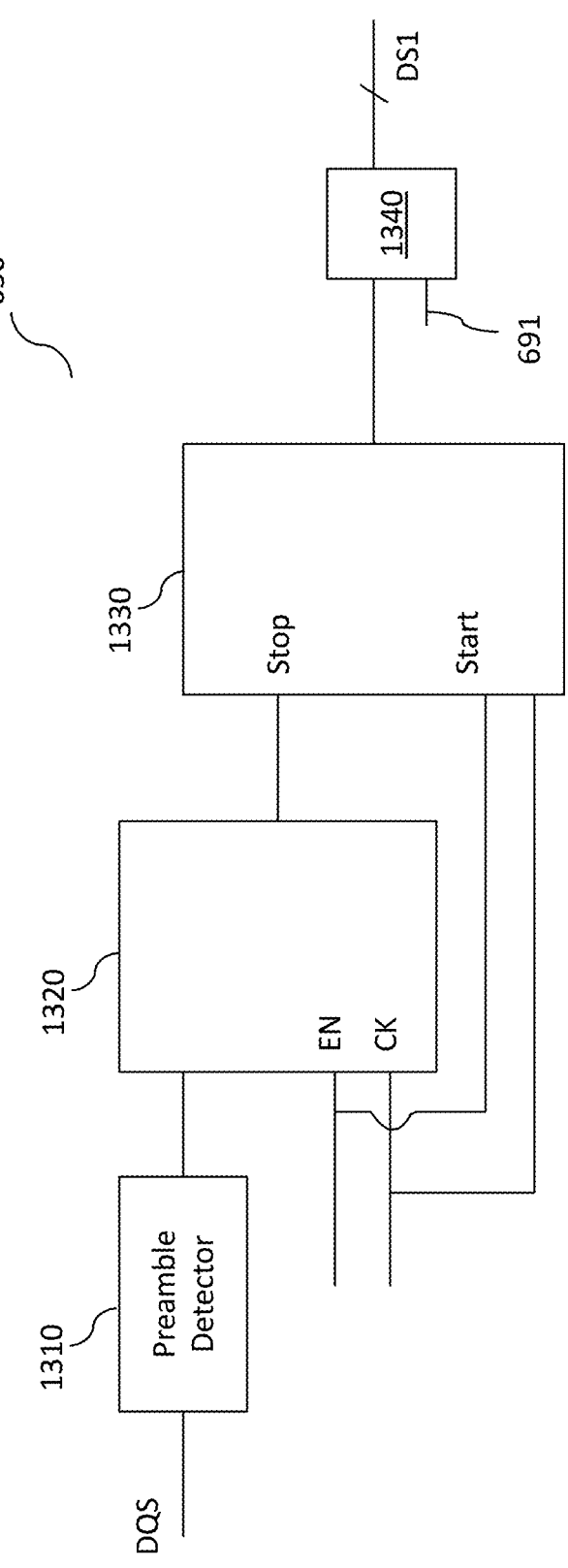
FIG. 13 is a diagram illustrating a delay control circuit in a data buffer according to certain embodiments.

The time interval between t4 and t3, i.e., the enable to write data delay EWD, is determined by the delay control circuit 650 in the DB Control circuit 310, as shown in FIG. 6. According to one embodiment, as shown in FIG. 13, the dynamic delay control circuit 650 includes a preamble detector 1310 to detect a write preamble in the DQS, a flip-flop circuit 1320 having an enable input EN receiving one of the data buffer control signals and a clock input CK receiving the buffered module clock signal CK0, and a counter circuit 1330 having a Start input receiving the one of the data buffer control signals, a Stop input receiving an output of the flip-flop circuit 1320. Thus, the output of the counter circuit would indicate a time interval from when the write preamble is detected and when the one of the data buffer control signal is received. This output is combined with the output from the programmable registers 671 in circuit 1340, which output the delay signal DS1.

Thus, as shown in FIG. 14, in one embodiment, a memory module 110 operates in the memory system 100 according to a method 1400. In the method, during a write operation, one or more data buffer control signals are received by an data buffer 118 from a module control circuit or module controller 116 (1410). The module controller 116 generates the one or more data buffer control signals in response to C/A signals representing a write command from the MCH 101. The one or more data buffer control signals are used to control the data buffer 118. For example, the one or more data buffer control signals may include one or more first enable signals to enable a write path to allow write data be communicated to a selected subgroup of memory devices among the group of memory devices coupled to the data buffer 118. After a time interval from receiving the one or more first enable signals, write data DQ and write strobe DQS are received by the data buffer 118 from the MCH 101 (1420). In one embodiment, upon receiving the one or more first enable signal, a counter is started, which is stopped when the write data DQ or write strobe DQS is received. Thus, a time interval EWD between receiving the one or more first enable signals and receiving the write strobe signal DQS is recorded.

Since the time interval between the arrival of the command signals from the MCH 101 and the arrival of the write data/strobe signal DQ/DQS from the MCH 101 is set according to a write latency parameter associated with the system 100, the time interval EWD can be used to ascertain a time interval CED between the time when a command signal is received by the memory module 110 and the time when the one or more enable signals are received by the data buffer 118. The time interval CED can be used by the data buffer 118 to properly time the transmission of read data to the MCH 101.

As shown in FIG. 14, a delay signal DS is generated according to the time interval EWD (1430). Concurrent to receiving the write strobe signal DQS, the data buffer 118 also receives a set of write data signals DQ (1440). The received write data signals are transmitted to the subgroup of memory devices (1450), which are selected from the group of memory devices coupled to the data buffer 118 by the one or more first enable signals.

During a read operation, another set of data buffer control signals including, for example, one or more second enable signals, are received by the data buffer 114 from the module controller 116 (1460). The one or more second enable signals are generated by the module controller 116 in response to read command signals received from the MCH 101, and are used by the data buffer 118 to select a subgroup of memory devices from which to receive read data. Afterwards, a read strobe signal DQS and a set of read data signal DQ are received from the selected subgroup of memory devices (1470). To properly time the transmission of the DQS and DQ signals to the MCH 101, the DQS and DQ signals are adjusted (e.g., delayed) according to the delay signal DS, such that the DQS and DQ signals follow a read command by a time interval consistent with a read latency parameter associated with the system 100.

We claim:

1. A memory module operable in a computer system having a memory controller and a system bus, the system bus including one or more clock signal lines, control/address (C/A) signal lines and data signal lines, the memory module comprising:
   a printed circuit board (PCB) having connectors configured to provide electrical connections between the memory module and the system bus;
   memory devices mounted on the PCB and organized in a plurality of groups, wherein a respective group of the memory devices is configurable to communicate data with the memory controller via a corresponding subset of the data signal lines;
   circuitry mounted on the PCB and configurable to:
   receive from the memory controller a system clock via the one or more clock signal lines and input control and address (C/A) signals via the C/A signal lines;
   generate module C/A signals in response to the input C/A signals;
   generate a plurality of local clocks corresponding, respectively, to the plurality of groups of the memory devices, the plurality of local clocks having respective phase relationships with the system clock, the respective phase relationships being programmable independently of each other; and
   output the module C/A signals to the memory devices; and
   output the plurality of local clocks to the memory devices, wherein a respective local clock having a respective programmable phase relationship with the system clock is output to a corresponding group of the memory devices and not to any other group of the memory devices, wherein the corresponding group of the memory devices is configurable to perform memory read or write operations by communicating data signals with the memory controller via a corresponding subset of data signal lines in accordance with the respective local clock.

2. The memory module of claim 1, wherein the circuitry includes logic and configuration registers programmable by the logic to control the respective phase relationships.

3. The memory module of claim 2, wherein:
   the memory module is operable in at least a normal operation mode and a configuration mode;
   the memory module in the normal operation mode is configurable to output or receive data signals via the data signal lines in response to memory read or write commands received via the C/A signal lines; and
   the memory module in the configuration mode is configurable to perform one or more operations to program the respective configuration registers.

4. The memory module of claim 3, wherein the memory module is configurable to perform the one or more operations in response to mode register command signals received from the memory controller.

5. The memory module of claim 2, wherein the circuitry further includes phase-locked loop circuit (PLL) circuitry to provide phase locking between the system clock and the plurality of local clocks, programmable delay circuitry to add respective delays to respective ones of the plurality of local clocks, and clock driver circuitry to drive the plurality of local clocks to the memory devices, the respective delays being controlled by respective registers that are programmable independently of each other.

6. A memory module operable in a computer system having a memory controller and a system bus, the system bus including one or more clock signal lines, control/address (C/A) signal lines and data/strobe signal lines, the memory module comprising:

a printed circuit board (PCB) having connectors configured to provide electrical connections between the memory module and the system bus;

memory devices mounted on the PCB, the memory devices including first memory devices and second memory devices;

circuitry on the PCB and coupled to the memory devices, wherein the circuitry is configurable to:

receive from the memory controller a system clock via the one or more clock signal lines and input control and address (C/A) signals via the C/A signal lines;

generate module C/A signals in response to the input C/A signals;

generate local clocks from the system clock, the local clocks including a first local clock having a first phase shift from the system clock and a second local clock having a second phase shift from the system clock, the first phase shift and the second phase shift being programmable independently of each other; and output the module C/A signals to the memory devices; and output the local clocks to the memory devices, wherein the first local clock is output to the first memory devices and not to any of the memory devices other than the first memory devices, the second local clock is output to the second memory devices and not to any of the memory devices other than the second memory devices, and wherein the first memory devices are configurable to perform memory read or write operations by communicating data/strobe signals in accordance with the first local clock via a first subset of the data/strobe signal lines, and the second subset of the memory devices are configurable to perform memory read or write operations by communicating data/strobe signals in accordance with the second local clock via a second subset of the data/strobe signal lines.

7. The memory module of claim 6, wherein the circuitry includes logic and configuration registers programmable by the logic, the registers including one or more first registers to control the first phase shift and one or more second registers to control the second phase shift.

8. The memory module of claim 7, wherein:

the memory module is operable in at least a normal operation mode and a configuration mode;

the memory module in the normal operation mode is configurable to output or receive data/strobe signals via the data/strobe signal lines in response to memory read or write commands received via the C/A signal lines; and the memory module in the configuration mode is configurable to perform one or more operations to program the configuration registers.

9. The memory module of claim 8, wherein the memory module is configurable to perform the one or more operations in response to mode register command signals received from the memory controller.

10. The memory module of claim 7, wherein the circuitry further includes phase-locked loop circuit (PLL) circuitry to provide phase locking between the system clock and the local clocks, programmable delay circuitry to add respective delays to respective ones of the local clocks, and clock driver circuitry to drive the local clocks to the memory devices, the respective delays being controlled by respective registers that are programmable independently of each other.

11. The memory module of claim 1, wherein:

the connectors including C/A connectors corresponding, respectively, to the C/A signal lines, and data connectors corresponding, respectively, to the data signal lines;

the input C/A signals include first input C/A signals for a memory write operation to write first data to the memory module;

the circuitry includes a module control device mounted on the PCB and configurable to receive the input C/A signals via the C/A connectors, and to output first module C/A signals and first module control signals for the write operation in response the first input C/A signals;

the circuitry further includes a plurality of data buffers mounted on the PCB and coupled to the module control device;

each data buffer of the plurality of data buffers is coupled between a respective subset of the data connectors and a corresponding group of the memory devices;

the first data has a bit width of N and includes m n-bit-wide sections corresponding, respectively, to m subsets of the data signal lines and to m data buffers of the plurality of data buffers, N=mxn, wherein n and m are integers greater than 1;

a respective data buffer of the m data buffers is configurable to receive the first module control signals and to receive a corresponding n-bit-wide section of the first data in response to the first module control signals;

the respective data buffer is further configurable to transmit the corresponding n-bit-wide section of the first data to at least a first branch of memory devices in the group of the memory devices coupled to the respective data buffer;

the respective data buffer is further configurable to generate a respective local clock and to transmit the respective local clock to at least the first branch of memory devices; and at least one first memory device in the first branch of memory devices is configurable to receive at least some of the first module C/A signals and the respective local clock, and to receive and store the corresponding n-bit-wide section of the first data in response to the at least some of the first module C/A signals and in accordance with the respective local clock.

12. The memory module of claim 11, wherein:

the module control device is further configurable to receive the system clock and to output a module clock; and the each respective data buffer of the m data buffers is further configured to receive the module clock and to generate the respective local clock from the module clock, the respective local clock having a respective phase shift from the module clock.

13. The memory module of claim 12, wherein the each respective data buffer includes logic and respective configuration registers programmable by the logic, and wherein the respective phase shift is dependent on one or more register settings in the respective configuration registers.

14. The memory module of claim 13, wherein:

the memory module is operable in at least a normal operation mode and a configuration mode;

the write operation is performed in the normal operation mode; and the respective configuration registers are programmed in one or more operations during the configuration mode.

15. The memory module of claim 14, wherein the memory module is configurable to perform the one or more operations in response to mode register command signals received from the memory controller.

16. The memory module of claim 12, wherein:

the m data buffers include a first data buffer and a second data buffer;

the first data buffer is configurable to generate a first local clock from the module clock in response to the module control signals and to transmit the first local clock to at least a first branch of a first section of memory devices;

the second data buffer is configurable to generate a second local clock from the module clock in response to the module control signals and to transmit the second local clock to at least a first branch of a second section of memory devices;

the first local clock has a first phase shift from the module clock;

the second local clock has a second phase shift from the module clock; and the first shift and the second phase shift are programmable independently of each other.

17. The memory module of claim 11, wherein:

the each respective data buffer of the m data buffers includes a first n-bit-wide write path coupled to the first branch of the respective section of the memory device and not to a second branch of the respective section of the memory device, and a second n-bit-wide write path coupled to the second branch of the respective section of the memory device and not to the first branch of the respective section of the memory device; and the each respective data buffer of the m data buffers is configurable to transmit the respective n-bit-wide section of the data associated with the write operation to the first branch of the respective section of the memory device via the first n-bit-wide write path and not to any memory device in the second branch of the respective section of the memory device via the second n-bit-wide write path.

18. The memory module of claim 17, wherein:

the each respective data buffer of the m data buffers further includes input buffers configurable to receive the respective n-bit-wide section of the data associated with the write operation;

selection circuitry coupled to the input buffers; and logic coupled to the selection circuitry and configurable to control the selection circuitry to select the first n-bit-wide write path to transmit the respective n-bit-wide section of the data associated with the write operation in response to the module control signals.

19. The memory module of claim 17, wherein the at least one first memory device includes one or more dynamic random access memory (DRAM) device each having a bit width of n/k, where k is a number of DRAM devices in the at least one first memory device, and k is 1, 2, or 4.

20. The memory module of claim 19, wherein n=8 or 16.

* * * * *